(12) United States Patent
Chung

(10) Patent No.: US 8,917,533 B2
(45) Date of Patent: Dec. 23, 2014

(54) CIRCUIT AND SYSTEM FOR TESTING A ONE-TIME PROGRAMMABLE (OTP) MEMORY

(71) Applicant: Shine C. Chung, San Jose, CA (US)

(72) Inventor: Shine C. Chung, San Jose, CA (US)

( * ) Notice: Subject to any disclaimer, the term of this patent is extended or adjusted under 35 U.S.C. 154(b) by 105 days.

(21) Appl. No.: 13/761,057

(22) Filed: Feb. 6, 2013

(65) Prior Publication Data

US 2013/0201746 A1 Aug. 8, 2013

Related U.S. Application Data

(60) Provisional application No. 61/595,170, filed on Feb. 6, 2012.

(51) Int. Cl.
| | | |
|---|---|---|
| *G11C 17/00* | (2006.01) | |
| *G11C 17/16* | (2006.01) | |
| *G11C 17/18* | (2006.01) | |
| *G11C 29/10* | (2006.01) | |
| *G11C 29/24* | (2006.01) | |

(52) U.S. Cl.
CPC ............... *G11C 17/16* (2013.01); *G11C 17/18* (2013.01); *G11C 29/10* (2013.01); *G11C 29/24* (2013.01); *G11C 17/00* (2013.01)
USPC .............................. 365/96; 365/94; 365/225.7

(58) Field of Classification Search
USPC .............. 365/96, 94, 201, 225.7, 148, 230.06
See application file for complete search history.

(56) References Cited

U.S. PATENT DOCUMENTS

| | | | |
|---|---|---|---|
| 3,198,670 | A | 8/1965 | Nissim |
| 3,715,242 | A | 2/1973 | Daniel |
| 4,148,046 | A | 4/1979 | Hendrickson et al. |
| 4,192,059 | A | 3/1980 | Khan et al. |
| 5,192,989 | A | 3/1993 | Matsushita et al. |
| 5,389,552 | A | 2/1995 | Iranmanesh |
| 5,635,742 | A | 6/1997 | Hoshi et al. |
| 5,962,903 | A | 10/1999 | Sung et al. |
| 6,140,687 | A | 10/2000 | Shimomura et al. |
| 6,243,864 | B1 | 6/2001 | Odani et al. |
| 6,400,540 | B1 | 6/2002 | Chang |
| 6,405,160 | B1 | 6/2002 | Djaja et al. |
| 6,461,934 | B2 | 10/2002 | Nishida et al. |

(Continued)

FOREIGN PATENT DOCUMENTS

| | | |
|---|---|---|
| CN | 1469473 A | 1/2004 |
| CN | 1691204 A | 11/2005 |

(Continued)

OTHER PUBLICATIONS

U.S. Appl. No. 13/471,704, filed May 15, 2012.

(Continued)

*Primary Examiner* — David Lam

(57) ABSTRACT

Circuits, systems and techniques for testing a One-Time Programmable (OTP) memory are disclosed. An extra OTP bit can be provided as a test sample to be programmed. The programmed extra OTP bit can be read with any virgin cells in the OTP memory alternatively to generate a stream of logic 0 and logic 1 data so that every row or column path can be tested and the outcome can be observed in a pseudo-checkerboard pattern or other predetermined pattern. By carefully setting control signals, checkerboard-like pattern can be generated without actual programming any OTP cells in the memory array.

19 Claims, 11 Drawing Sheets

(56) References Cited

U.S. PATENT DOCUMENTS

| | | |
|---|---|---|
| 6,483,734 B1 | 11/2002 | Sharma et al. |
| 6,611,043 B2 | 8/2003 | Takiguchi |
| 6,731,535 B1 | 5/2004 | Ooishi et al. |
| 6,770,953 B2 | 8/2004 | Boeck et al. |
| 6,803,804 B2 | 10/2004 | Madurawe |
| 6,813,705 B2 | 11/2004 | Duesterwald et al. |
| 6,944,083 B2 | 9/2005 | Pedlow |
| 6,967,879 B2 | 11/2005 | Mizukoshi |
| 7,212,432 B2 | 5/2007 | Ferrant et al. |
| 7,263,027 B2 | 8/2007 | Kim et al. |
| 7,294,542 B2 | 11/2007 | Okushima |
| 7,391,064 B1 | 6/2008 | Tripsas et al. |
| 7,411,844 B2 | 8/2008 | Nitzan et al. |
| 7,461,371 B2 | 12/2008 | Luo et al. |
| 7,573,762 B2 | 8/2009 | Kenkare et al. |
| 7,696,017 B1 | 4/2010 | Tripsas et al. |
| 7,701,038 B2 | 4/2010 | Chen et al. |
| 7,764,532 B2 | 7/2010 | Kurjanowicz et al. |
| 7,802,057 B2 | 9/2010 | Iyer et al. |
| 7,833,823 B2 | 11/2010 | Klersy |
| 7,889,204 B2 | 2/2011 | Hansen et al. |
| 8,008,723 B2 | 8/2011 | Nagai |
| 8,089,137 B2 | 1/2012 | Lung et al. |
| 8,115,280 B2 | 2/2012 | Chen et al. |
| 8,119,048 B2 | 2/2012 | Nishimura |
| 8,168,538 B2 | 5/2012 | Chen et al. |
| 8,179,711 B2 | 5/2012 | Kim et al. |
| 8,183,665 B2 | 5/2012 | Bertin et al. |
| 8,217,490 B2 | 7/2012 | Bertin et al. |
| 8,369,166 B2 | 2/2013 | Kurjanowicz et al. |
| 8,373,254 B2 | 2/2013 | Chen et al. |
| 8,482,972 B2 | 7/2013 | Chung |
| 8,488,359 B2 | 7/2013 | Chung |
| 8,488,364 B2 | 7/2013 | Chung |
| 8,514,606 B2 | 8/2013 | Chung |
| 8,526,254 B2 * | 9/2013 | Kurjanowicz .............. 365/201 |
| 8,570,800 B2 | 10/2013 | Chung |
| 8,817,563 B2 | 8/2014 | Chung |
| 8,830,720 B2 | 9/2014 | Chung |
| 8,854,859 B2 | 10/2014 | Chung |
| 8,861,249 B2 | 10/2014 | Chung |
| 2003/0135709 A1 | 7/2003 | Niles et al. |
| 2003/0169625 A1 | 9/2003 | Hush et al. |
| 2004/0057271 A1 | 3/2004 | Parkinson |
| 2004/0113183 A1 | 6/2004 | Karpov et al. |
| 2005/0060500 A1 | 3/2005 | Luo et al. |
| 2005/0110081 A1 | 5/2005 | Pendharkar |
| 2005/0124116 A1 | 6/2005 | Hsu et al. |
| 2005/0146962 A1 | 7/2005 | Schreck |
| 2006/0072357 A1 | 4/2006 | Wicker |
| 2006/0092689 A1 | 5/2006 | Braun et al. |
| 2006/0104111 A1 | 5/2006 | Tripsas et al. |
| 2006/0120148 A1 | 6/2006 | Kim et al. |
| 2006/0129782 A1 | 6/2006 | Bansai et al. |
| 2006/0215440 A1 | 9/2006 | Cho et al. |
| 2007/0081377 A1 | 4/2007 | Zheng et al. |
| 2007/0133341 A1 | 6/2007 | Lee et al. |
| 2007/0138549 A1 | 6/2007 | Wu et al. |
| 2007/0279978 A1 | 12/2007 | Ho et al. |
| 2008/0025068 A1 | 1/2008 | Scheuerlein et al. |
| 2008/0044959 A1 | 2/2008 | Cheng et al. |
| 2008/0105878 A1 | 5/2008 | Ohara |
| 2008/0151612 A1 | 6/2008 | Pellizzer et al. |
| 2008/0220560 A1 | 9/2008 | Klersy |
| 2009/0055617 A1 | 2/2009 | Bansai et al. |
| 2009/0168493 A1 | 7/2009 | Kim et al. |
| 2009/0172315 A1 | 7/2009 | Iyer et al. |
| 2009/0180310 A1 | 7/2009 | Shimomura et al. |
| 2009/0194839 A1 | 8/2009 | Bertin et al. |
| 2009/0213660 A1 | 8/2009 | Pikhay et al. |
| 2009/0219756 A1 | 9/2009 | Schroegmeier et al. |
| 2009/0309089 A1 | 12/2009 | Hsia et al. |
| 2010/0091546 A1 | 4/2010 | Liu et al. |
| 2010/0142254 A1 | 6/2010 | Choi et al. |
| 2010/0171086 A1 | 7/2010 | Lung et al. |
| 2010/0232203 A1 | 9/2010 | Chung et al. |
| 2010/0238701 A1 | 9/2010 | Tsukamoto et al. |
| 2010/0277967 A1 | 11/2010 | Lee et al. |
| 2010/0301304 A1 | 12/2010 | Chen et al. |
| 2011/0128772 A1 | 6/2011 | Kim et al. |
| 2011/0145777 A1 | 6/2011 | Iyer et al. |
| 2011/0260289 A1 | 10/2011 | Oyamada |
| 2011/0297912 A1 | 12/2011 | Samachisa et al. |
| 2011/0312166 A1 | 12/2011 | Yedinak et al. |
| 2012/0032303 A1 | 2/2012 | Elkareh et al. |
| 2012/0044736 A1 | 2/2012 | Chung |
| 2012/0044737 A1 | 2/2012 | Chung |
| 2012/0044738 A1 | 2/2012 | Chung |
| 2012/0044739 A1 | 2/2012 | Chung |
| 2012/0044740 A1 | 2/2012 | Chung |
| 2012/0044743 A1 | 2/2012 | Chung |
| 2012/0044744 A1 | 2/2012 | Chung |
| 2012/0044745 A1 | 2/2012 | Chung |
| 2012/0044746 A1 | 2/2012 | Chung |
| 2012/0044747 A1 | 2/2012 | Chung |
| 2012/0044748 A1 | 2/2012 | Chung |
| 2012/0044753 A1 | 2/2012 | Chung |
| 2012/0044756 A1 | 2/2012 | Chung |
| 2012/0044757 A1 | 2/2012 | Chung |
| 2012/0044758 A1 | 2/2012 | Chung |
| 2012/0047322 A1 | 2/2012 | Chung |
| 2012/0074460 A1 | 3/2012 | Kitagawa |
| 2012/0106231 A1 | 5/2012 | Chung |
| 2012/0147653 A1 | 6/2012 | Chung |
| 2012/0147657 A1 | 6/2012 | Sekar et al. |
| 2012/0209888 A1 | 8/2012 | Chung |
| 2012/0224406 A1 | 9/2012 | Chung |
| 2012/0314472 A1 | 12/2012 | Chung |
| 2012/0314473 A1 | 12/2012 | Chung |
| 2012/0320656 A1 | 12/2012 | Chung |
| 2012/0320657 A1 | 12/2012 | Chung |
| 2013/0148409 A1 | 6/2013 | Chung |
| 2013/0189829 A1 | 7/2013 | Mieczkowski et al. |
| 2013/0200488 A1 | 8/2013 | Chung |
| 2013/0201745 A1 | 8/2013 | Chung |
| 2013/0201748 A1 | 8/2013 | Chung |
| 2013/0201749 A1 | 8/2013 | Chung |
| 2013/0215663 A1 | 8/2013 | Chung |
| 2013/0235644 A1 | 9/2013 | Chung |
| 2014/0071726 A1 | 3/2014 | Chung |
| 2014/0131710 A1 | 5/2014 | Chung |
| 2014/0131711 A1 | 5/2014 | Chung |
| 2014/0131764 A1 | 5/2014 | Chung |
| 2014/0133056 A1 | 5/2014 | Chung |
| 2014/0211567 A1 | 7/2014 | Chung |
| 2014/0269135 A1 | 9/2014 | Chung |

FOREIGN PATENT DOCUMENTS

| | | |
|---|---|---|
| CN | 101083227 A | 5/2007 |
| CN | 101057330 A | 10/2007 |
| CN | 101188140 A | 5/2008 |
| CN | 101271881 A | 9/2008 |
| CN | 101483062 A | 7/2009 |
| CN | 101728412 A | 6/2010 |
| JP | 03-264814 | 11/1991 |
| TW | I309081 | 4/2009 |

OTHER PUBLICATIONS

U.S. Appl. No. 13/026,650, filed Feb. 14, 2011.
U.S. Appl. No. 13/026,656, filed Feb. 14, 2011.
U.S. Appl. No. 13/026,664, filed Feb. 14, 2011.
U.S. Appl. No. 13/026,678, filed Feb. 14, 2011.
U.S. Appl. No. 13/026,692, filed Feb. 14, 2011.
U.S. Appl. No. 13/026,704, filed Feb. 14, 2011.
U.S. Appl. No. 13/026,717, filed Feb. 14, 2011.
U.S. Appl. No. 13/026,725, filed Feb. 14, 2011.
U.S. Appl. No. 13/026,752, filed Feb. 14, 2011.
U.S. Appl. No. 13/026,771, filed Feb. 14, 2011.
U.S. Appl. No. 13/026,783, filed Feb. 14, 2011.
U.S. Appl. No. 13/026,835, filed Feb. 14, 2011.
U.S. Appl. No. 13/026,840, filed Feb. 14, 2011.

(56) References Cited

OTHER PUBLICATIONS

U.S. Appl. No. 13/026,852, filed Feb. 14, 2011.
U.S. Appl. No. 13/214,198, filed Aug. 21, 2011.
U.S. Appl. No. 13/590,044, filed Aug. 20, 2012.
U.S. Appl. No. 13/590,047, filed Aug. 20, 2012.
U.S. Appl. No. 13/590,049, filed Aug. 20, 2012.
U.S. Appl. No. 13/590,050, filed Aug. 20, 2012.
U.S. Appl. No. 13/214,183, filed Aug. 20, 2011.
U.S. Appl. No. 13/288,843, filed Nov. 3, 2011.
U.S. Appl. No. 13/314,444, filed Dec. 8, 2011.
U.S. Appl. No. 13/397,673, filed Feb. 15, 2012.
U.S. Appl. No. 13/571,797, filed Aug. 10, 2012.
U.S. Appl. No. 13/678,539, filed Nov. 15, 2012.
U.S. Appl. No. 13/678,544, filed Nov. 15, 2012.
U.S. Appl. No. 13/678,541, filed Nov. 15, 2012.
U.S. Appl. No. 13/678,543, filed Nov. 15, 2012.
Ahn, S.J. et al, "Highly Reliable 50nm Contact Cell Technology for 256Mb PRAM," IEEE VLSI Tech Symp., Jun. 2005, pp. 98-99.
Alavi, Mohsen, et al., "A PROM Element Based on Salicide Allgomeration of Poly Fuses in a CMOS Logic Process," IEEE IEDM, 97, pp. 855-858.
Andre, T. W. et al., "A 4-Mb 0.18um 1T1MTJ Toggle MRAM With Balanced Three Input Sensing Scheme and Locally Mirrored Unidirectional Write Drivers," IEEE J. of Solid-State Circuits, vol. 40, No. 1, Jan. 2005, pp. 301-309.
Ang, Boon et al., "NiSi Polysilicon Fuse Reliability in 65nm Logic CMOS Technology," IEEE Trans. on Dev. Mat. Rel. vol. 7, No. 2, Jun. 2007, pp. 298-303.
Aziz, A. et al., "Lateral Polysilicon n+p Diodes: Effect of the Grain boundaries and of the p-Implemented Doping Level on the I-V and C-V Characteristics, "Springer Proceedings in Physics, vol. 54, 1991, pp. 318-322.
Aziz, A. et al., "Lateral Polysilicon PN Diodes: Current-Voltage Characteristics Simulation Between 200K and 400K a Numerical Approach," IEEE Trans. on Elec. Dev., vol. 41, No. 2, Feb. 1994, pp. 204-211.
Banerjee, Kaustav et al., "High Current Effects in Silicide Films for Sub-0.25um VLSI Technologies," IEEE 36th IRPS, 1998, pp. 284-292.
Bedeschi, F. et al., "4-Mb MOSFET-Selected uTrench Phase-Change Memory Experimental Chip," IEEE J. of Solid-State Circuits, vol. 40, No. 7, Jul. 2005, pp. 1557-1565.
Bedeschi, F. et al., "A Bipolar-Selected Phase Change Memory Featuring Multi-Level Cell Storage," IEEE J. Sol. Stat. Cir., vol. 44, No. 1, Jan. 2009, pp. 217-227.
Bedeschi, F. et al., "A Fully Symmetrical Sense Amplifier for Non-volatile Memories," IEEE. Int. Symp. on Circuits and Systems, (ISCAS), vol. 2, 2004, pp. 625-628.
Bedeschi, F. et al., "An 8Mb Demonstrator for High-Density 1.8V Phase-Change Memories," VLIS Cir. Symp, Jun. 2004, pp. 442-445.
Bedeschi, F. et al., "SET and RESET Pulse Characterization in BJT-Selected Phase-Change Memory," IEEE Int. Symp. On Circuits and Systems (ISCAS), 2005, pp. 1270-1273.
Braganca, P. M. et al., "A Three-Terminal Approach to Developing Spin-Torque Written Magnetic Random Access Memory Cells," IEEE Trans. on Nano. vol. 8, No. 2, Mar. 2009, pp. 190-195.
Cagli, C. et al., "Evidence for threshold switching in the set process of NiO-based RRAM and physical modeling for set, reset, retention and disturb prediction," IEEE IEDM, 2008, pp. 1-4.
Chan, W. T. et al., "CMOS Compatible Zero-Mask One-Time Programmable (OTP) Memory Design," Proc. Int. Conf. Solid State Integr. Cir. Tech., Beijing, China, Oct. 20-23, 2008, pp. 861-864.
Chan, Wan Tim, et al., "CMOS Compatible Zero-Mask One Time Programmable Memory Design", Master Thesis, Hong-Kong University of Science and Technologies, 2008.
Chang, Meng-Fan et al., "Circuit Design Challenges in Embedded Memory and Resistive RAM (RRAM) for Mobile SoC and 3D-IC", Design Automation Conference (ASP-DAC), 16th Asia and South Pacific, 2011, pp. 197-203.
Cheng, Yu-Hsing et al., "Failure Analysis and Optimization of Metal Fuses for Post Package Trimming," IEEE 45th IRPS, 2007, pp. 616-617.
Chiu, Pi-Feng et al., "A Low Store Energy, Low VDDmin, Nonvolatile 8T2R SRAM with 3D Stacked RRAM Devices for Low Power Mobile Applications," IEEE VLSI Cir./Tech Symp., Jun. 2010, pp. 229-230.
Cho, Woo Yeong et al., "A 0.18um 3.0V 64Mb Non-Volatile Phase-Transition Random-Access Memory (PRAM)," ISSCC, Feb. 2004, Sec. 2-1.
Choi, Sang-Jun et al., "Improvement of CBRAM Resistance Window by Scaling Down Electrode Size in Pure-GeTe Film," IEEE Elec. Dev., vol. 30, No. 2, Feb. 2009, pp. 120-122.
Choi, Youngdon et al., "A 20nm 1.8V 8Gb PRAM with 40MB/s Program Bandwidth," IEEE ISSCC, 2012, pp. 46-47.
Chung, S. et al., "A 1.25um2 Cell 32Kb Electrical Fuse Memory in 32nm CMOS with 700mV Vddmin and Parallel/Serial Interface," VLSI Cir. Symp., Jun. 2009, pp. 30-31.
Chung, S. et al., "A 512x8 Electrical Fuse Memory with 15um2 Cells Using 8-sq Asymmetrical Fuse and Core Devices in 90nm CMOS," VLSI Cir. Symp., Jun. 2007, pp. 74-75.
Crowley, Matthew et al., "512Mb PROM with 8 Layers of Antifuse/Diode Cells," IEEE ISSCC 2003, Sec. 16.4.
De Sandre, Guido et al., "A 4Mb LV MOS-Selected Embedded Phase Change Memory in 90nm Standard CMOS Technology," IEEE J. Sol. Stat. Cir, vol. 46. No. 1, Jan. 2011, pp. 52-63.
De Sandre, Guido et al., "A 90nm 4Mb Embedded Phase-Change Memory with 1.2V 12ns Read Access Time and 1MB/s Write Throughput," ISSCC 2010, Sec. 14.7.
Desikan, Rajagopalan et al., "On-Chip MRAM as a High-Bandwidth Low-Latency Replacement for DRAM Physical Memories," Tech Report TR-02-47, Dept. of Computer Science, University of Texas, Austin, Sep. 27, 2002, 18 pages.
Dietrich, Stefan et al., "A Nonvolatile 2-Mbit CBRAM Memory Core Featuring Advanced Read and Program Control," IEEE J. of Solid-Stat Cir., vol. 42, No. 4, Apr. 2007, pp. 839-845.
Dion, Michael J., "Reservoir Modeling for Electromigration Improvement of Metal Systems with Refractory Barriers," IEEE 39th IRPS, 2001, pp. 327-333.
Doorn, T. S. et al., "Ultra-fast Programming of Silicided Polysilicon Fuses Based on New Insights in the Programming Physics," IEEE IEDM, 2005, pp. 667-670.
Doorn, T. S., "Detailed Qualitative Model for the Programming Physics of Silicided Polysilicon Fuses," IEEE Trans. on Elec. Dev. vol. 54, No. 12, Dec. 2007, pp. 3285-3291.
Durlam, M. et al., "A 1-Mbit MRAM Based on 1T1MTJ Bit Cell Integrated With Copper Interconnects," IEEE J. of Solid-State Circuits, vol. 38, No. 5, May 2003, pp. 769-773.
Engel, B. et al., "The Science and Technology of Magnetoresistive Tunnel Memory," IEEE Tran. on Nanotechnology, vol. 1, No. 1, Mar. 2002, pp. 32-38.
Engel, B.N. et al., "A 4Mb Toggle MRAM Based on a Novel bit and Switching Method," IEEE Trans. on Mag. vol. 41, No. 1, Jan. 2005, pp. 132-136.
Fellner, Johannes, et al., "Lifetime Study for a Poly Fuse in a 0.35um Polycide CMOS Process," IEEE 43rd IRPS, 2005, pp. 446-449.
Gao, B. et al., "Oxide-Based RRAM: Uniformity Improvement Using a New Material-Oriented Methodology," IEEE VLSI Tech. Symp., Jun. 2009, pp. 30-31.
Gao, B. et al., "Oxide-Based RRAM Switching Mechanism: A New Ion-Transport-Recombination Model," IEDM, Dec. 2008, pp. 563-566.
Gill, M. et al., "Ovonic Unified Memory—A High Performance Nonvolatile Memory Technology for Stand-Alone Memory and Embedded Applications," IEEE, ISSCC Dig. of Tech. Paper, Feb. 2002, pp. 202-203.
Gogl, D. et al., "A 16-Mb MRAM Featuring Bootstrapped Write Drivers," IEEE J. of Solid-State Circuits, vol. 40, No. 4, Apr. 2005, pp. 902-908.
Gopalan, C. et al., Demonstration of Conductive Bridging Random Access Memory (CBRAM) in Logic CMOS Process, IEEE Int. Memory Workshop, 2010, pp. 1-4.

(56) References Cited

OTHER PUBLICATIONS

Ha, Daewon and Kim, Kinam, "Recent Advances in High Density Phase Change Memory (PRAM)," IEEE VLSI Tech. Symp. Jun. 2007.

Hosoi, Y. et al., "High Speed Unipolar Switching Resistance RAM (RRAM) Technology," IEEE IEDM, Dec. 2006, pp. 1-4.

Hosomi, M. et al., "A Novel Nonvolatile Memory with Spin Torque Transfer Magnetization Switching: Spin-RAM," IEEE IEDM Dig. of Tech. Paper, Dec. 2005, pp. 459-463.

Huang, Chia-En et al., "A New CMOS Logic Anti-Fuse Cell with Programmable Contact," IEEE IEDM Tech. Dig. 2007, pp. 48-51.

Im, Jay et al., "Characterization of Silicided Polysilicon Fuse Implemented in 65nm CMOS Technology,"7th Annual Non-Volatile Memory Technology Symp, (NVMTS) 2006, pp. 55-57.

Jin, Li-Yan et al., "Low-Area 1-Kb Multi-Bit OTP IP Design," IEEE 8th Int. Conf. on ASIC (ASICON), 2009. pp. 629-632.

Johnson, Mark et al., "512Mb PROM with a Three-Dimensional Array of Diode/Antifuse Memory Cells," IEEE J. of Sol. Stat. Cir., vol. 38, No. 11, Nov. 2003, pp. 1920-1928.

Kalnitsy, Alexander et al., "CoSi2 Integrated Fuses on Poly Silicon for Low Voltage 0.18um CMOS Applications," IEEE IEDM 1999, pp. 765-768.

Kang, Han-Byul et al., "Electromigration of NiSi Poly Gated Electrical Fuse and Its Resistance Behaviors Induced by High Temperature," IEEE IRPS, 2010, pp. 265-270.

Kang, Sangbeom et al., "A 0.1um 1.8V 256Mb Phase-Change Random Access Memory (PRAM) with 66Mhz Synchronous Burst-Read," IEEE J. of Sol. Stat. Cir. vol. 42. No. 1, Jan. 2007, pp. 210-218.

Kawhara, T. et al., "2Mb Spin-Transfer Torque RAM (SPRAM) with Bit-by-Bit Bidirectional Current Write and Parallelizing-Direction Current Read," IEEE ISSCC Dig. of Tech. Paper, Feb. 2007, pp. 480-481.

Ker, Ming-Dou et al., "High-Current Characterization of Polysilicon Diode for Electrostatic Discharge Protection in Sub-Quarter-Micron Complementary Metal Oxide Semiconductor Technology," Jpn. J. Appl. Phys. vol. 42 (2003) pp. 3377-3378.

Ker, Ming-Dou et al., "Ultra-High-Voltage Charge Pump Circuit in Low-Voltage Bulk CMOS Processes With Polysilicon Diodes," IEEE Trans. on Cir. And Sys.-II: Exp. Brief., vol. 54, No. 1, Jan. 2007, pp. 47-51.

Kim, Deok-Kee et al., "An Investigation of Electrical Current Induced Phase Transitions in the NiPtSi/Polysilicon System," J. App. Phy. 103, 073708 (2008).

Kim, I. S. et al., "High Performance PRAM Cell Scalable to sub-20nm Technology with below 4F2 Cell Size, Extendable to DRAM Applications," IEEE VLSI Tech Symp., Jun. 2010, pp. 203-204.

Kim, Jinbong et al., "3-Transistor Antifuse OTP ROM Array Using Standard CMOS Process," IEEE VLSI Cir. Symposium, Jun. 2003, pp. 239-242.

Kim, O. et al., "CMOS trimming circuit based on polysilicon fusing," Elec. Lett. vol. 34, No. 4, pp. 355-356, Feb. 1998.

Klee, V. et al., "A 0.13um Logic-Based Embedded DRAM Technology with Electrical Fuses, Cu Interconnect in SiLK, sub-7ns Random Access Time and its Extension to the 0.10um Generation," IEEE IEDM, 2001, pp. 407-410.

Kothandaramam, C. et al., "Electrically programmable fuse (eFUSE) using electromigration in silicides," IEEE Elec. Dev. Lett., vol. 23, No. 9, pp. 523-525, Sep. 2002.

Kulkarni, S. et al., "High-Density 3-D Metal-Fuse PROM Featuring 1.37um2 1T1R Bit Cell in 32nm High-K Metal-Gate CMOS Technology," VLSI Cir. Symp., Jun. 2009 pp. 28-29.

Kulkarni, S. et al., "A 4Kb Metal-Fuse OTP-ROM Macro Featuring a 2V Programmable 1.37um2 1T1R Bit Cell in 32nm High-K Metal-Gate CMOS," IEEE J. of Sol. Stat. Cir, vol., 45, No. 4, Apr. 2010, pp. 863-868.

Kund, Michael et al., "Conductive Bridging RAM (CBRAM): An Emerging Non-Volatile Memory Technology Scalable to Sub 20nm," IEEE IEDM 2005, pp. 754-757.

Lai, Han-Chao et al., "A 0.26um2 U-Shaped Nitride-Based Programming Cell on Pure 90nm CMOS Technology," IEEE Elec. Dev. Lett. vol. 28, No. 9, Sep. 2007, pp. 837-839.

Lai, S., "Current Status of the Phase Change Memory and Its Future," IEEE IEDM Dig. of Tech. Paper, Dec. 2003, pp. 255-258.

Lee, H.Y. et al., "Low Power and High Speed Bipolar Switching with a Thin Reactive Ti Buffer Layer in Robust HfO2 Based RRAM," IEEE IEDM, 2008, pp. 1-4.

Lee, K.J., et al., "A 90nm 1.8V 512Mb Diode-Switch PRAM with 266MB/s Read Throughout," IEEE ISSCC Dig. of Tech. Paper, Feb. 2007, 3 pgs.

Lee, Kwang-Jin et al., "A 90nm 1.8V 512Mb Diode-Switch PRAM with 266MB/s Read Throughput," IEEE J. of Sol. Stat. Cir., vol. 43, No. 1, Jan. 2008, pp. 150-162.

Lee, M.-J. et al., "Stack Friendly all-Oxide 3D RRAM Using GaInZnO Peripheral TFT Realized Over Glass Substrates," IEDM, Dec. 2008. pp. 1-4.

Lee, Man Chiu et al., "OTP Memory for Low Cost Passive RFID Tags," IEEE Conf. on Electron Devices and Solid-State Circuits (EDSSC), 2007, pp. 633-636.

Liaw, Corvin et al., "The Conductive Bridging Random Access Memory (CBRAM): A Non-volatile Multi-Level Memory Technology," 37th European Solid-State Device Research Conference (ESSDERC), 2007, pp. 226-229.

Lim, Kyunam et al., "Bit Line Coupling Scheme and Electrical Fuse Circuit for Reliable Operation of High Density DRAM," IEEE VLSI Cir. Symp. Jun. 2001, pp. 33-34.

Maffitt, T. et al., "Design Considerations for MRAM," IBM J. Res. & Dev., vol. 50, No. 1, Jan. 2006, pp. 25-39.

Meng, X.Z. et al., "Reliability Concept for Electrical Fuses," IEE Proc.-Sci Meas. Technol., vol. 144, No. 2, Mar. 1997, pp. 87-92.

Min, Byung-Jun et al., "An Embedded Non-volatile FRAM with Electrical Fuse Repair Scheme and One Time Programming Scheme for High Performance Smart Cards," IEEE CICC, Nov. 2005, pp. 255-258.

Mojumder, N. N. et al., "Three-Terminal Dual-Pillar STT-MRAM for High Performance Robust Memory Applications," IEEE Trans. Elec. Dev. vol. 58. No. 5, May 2011, pp. 1508-1516.

Morimoto, T. et al., "A NiSi Salicide Technology for Advanced Logic Devices," IEEE IEDM, Dec. 1991, pp. 653-656.

Neale, Ron, "PCM Progress Report No. 6 Afterthoughts," http://www.eetimes.com/General/PrintView/4236240, Feb. 13, 2012, 5 pages.

Nebashi, R. et al., "A 90nm 12ns 32Mb 2T1MTJ MRAM," IEEE ISSCC Dig. of Tech. Paper, Sess. 27.4, Feb. 2009, 3 pages.

Ng, K.P. et al., "Diode-Base Gate Oxide Anti-Fuse One-Time Programmable Memory Array in Standard CMOS Process," IEEE Int. Conf. of Elect. Dev. & Solid-Stat Cir. (EDSSC), Dec. 2009, pp. 457-460.

Ohbayashi, Shigeki et al., "A 65nm Embedded SRAM With Wafer Level Burn-In Mode, Leak-Bit Redundancy and Cu E-Trim Fuse for Known Good Die," IEEE J. of Solid. Stat. Cir., vol. 43, No. 1, Jan. 2008, pp. 96-108.

Oh, G. H. et al., "Parallel Multi-Confined (PMC) Cell Technology for High Density MLC PRAM," IEEE VLSI Tech. Symp., Jun. 2009, pp. 220-221.

Oh, J. H. et al., "Full Integration of Highly Manufacturable 512Mb PRAM Based on 90nm Technology," IEEE IEDM Dig. of Tech. Paper, Dec. 2006, pp. 1-4.

Osada, K. et al., "Phase Change RAM Operated with 1.5V CMOS as Low Cost Embedded Memory," IEEE CICC, Nov. 2005, pp. 431-434.

Park, Don et al., "Study on Reliability of Metal Fuse for Sub-100nm Technology," IEEE Int. Symp. On Semiconductor Manufacturing (ISSM), 2005, pp. 420-421.

Park, Jongwoo et al., "Phase Transformation of Programmed NiSi Electrical Fuse: Diffusion, Agglomeration, and Thermal Stability," 18th IEEE Int. Symp. On Physical and Failure Analysis of Integrated Circuits, (IPFA), 2011, pp. 1-7.

Park, Young-Bae et al., "Design of an eFuse OTP Memory of 8 Bits Based on a 0.35um BCD Process," Mobile It Convergence (ICMIC), 2011 Int. Conf. on, pp. 137-139.

(56) References Cited

OTHER PUBLICATIONS

Pellizzer, F. et al., "Novel uTrench Phase-Change Memory Cell for Embedded and Stand-alone Non-Volatile Memory Applications," IEEE VLSI Tech Symp. Jun. 2004, pp. 18-19.
Peng, J. et al., "A Novel Embedded OTP NVM Using Standard Foundry CMOS Logic Technology," IEEE 21st Non-Volatile Semiconductor Memory Workshop (NVSMW) 2006, pp. 24-26.
Rizzolo, R. F. et al., "IBM System z9 eFUSE applications and methodology," IBM J. Res. & Dev. vol. 51 No. 1/2 Jan./Mar. 2007, pp. 65-75.
Robson, Norm et al., "Electrically Programmable Fuse (eFuse) from Memory Redundancy to Autonomic Chips," IEEE CICC, 2007, pp. 799-804.
Russo, U. et al., "Conductive-Filament Switching Analysis and Self-Accelerated Thermal Dissolution Model for Reset in NiO-based RRAM," IEDM, Dec. 2007, pp. 775-778.
Safran, J. et al., "A Compact eFUSE Programmable Array Memory for SOI CMOS," VLSI Cir. Symp. Jun. 2007, pp. 72-73.
Sasaki, Takahiko et al., "Metal-Segregate-Quench Programming of Electrical Fuse," IEEE 43rd IRPS, 2005, pp. 347-351.
Schrogmeier, P. et al., "Time Discrete Voltage Sensing and Iterative Programming Control for a 4F2 Multilevel CBRAM," VLSI Cir. Symp., Jun. 2007, pp. 186-187.
Sheu, Shyh-Shyuan et al., "A 5ns Fast Write Multi-Level Non-Volatile 1K-bits RRAM Memory with Advance Write Scheme," VLSI Cir. Symp., Jun. 2009, pp. 82-83.
Sheu, Shyh-Shyuan et al., "Fast-Write Resistive RAM (RRAM) for Embedded Applications," IEEE Design & Test of Computers, Jan./Feb. 2011, pp. 64-71.
Shi, Min et al., "Zero-Mask Contact Fuse for One-Time-Programmable Memory in Standard CMOS Processes," IEEE Dev. Lett. vol. 32, No. 7, Jul. 2011, pp. 955-957.
Song, Y. J. et al., "Highly Reliable 256Mb PRAM with Advanced Ring Contact Technology and Novel Encapsulating Technology," IEEE VLSI Tech Symp., Jun. 2006, pp. 153-154.
Suto, Hiroyuki et al., "Programming Conditions for Silicided Poly-Si or Copper Electrically Programmable Fuses," IEEE IIRW Final Report, 2007, pp. 84-89.
Suto, Hiroyuki et al., "Study of Electrically Programmable Fuses Through Series of I-V Measurements," IEEE IIRW Final Report, 2006, pp. 83-86.
Suto, Hiroyuki et al., "Systematic Study of the Dopant-Dependent Properties of Electrically Programmable Fuses With Silicide Poly-Si Links Through a Series of I-V Measurements," IEEE Trans. on Dev. Mat. Rel. vol. 7, No. 2, Jun. 2007, pp. 285-297.
Takaoka, H. et al., A Novel Via-fuse Technology Featuring Highly Stable Blow Operation with Large On-off Ratio for 32nm Node and Beyond, IEDM, 2007, pp. 43-46.
Tehrani, S. et al., "Magnetoresistive Random Access Memory Using Magnetic Tunnel Junction," Proc. of IEEE, vol. 91, No. 5, May 2003, pp. 703-714.
Tehrani, S., "Status and Outlook of MRAM Memory Technology," IEEE IEDM Dig. of Tech Paper., Dec. 2006, pp. 1-4.
Teichmann, J. et al., "One Time Programming (OTP) with Zener Diodes in CMOS Processes," 33rd Conf. on European Solid-State Device Research (ESSDERC), 2003, pp. 433-436.
Tian, C. et al., "Reliability Investigation of NiPtSi Electrical Fuse with Different Programming Mechanisms," IEEE IIRW Final Report, 2007, pp. 90-93.
Tian, C. et al., "Reliability Qualification of CoSi2 Electrical Fuse for 90nm Technology," IEEE 44th IRPS, 2006, pp. 392-397.
Tian, Chunyan et al., "Reliability Investigation of NiPtSi Electrical Fuse with Different Programming Mechanisms," IEEE Trans. on Dev. Mat. Rel. vol. 8, No. 3, Sep. 2008, pp. 536-542.
Tonti, W. R. et al., "Product Specific Sub-Micron E-Fuse Reliability and Design Qualification," IEEE IIRW Final Report, 2003, pp. 36-40.
Tonti, W. R., "Reliability and Design Qualification of a Sub-Micro Tungsten Silicide E-Fuse," IEEE IRPS Proceedings, 2004, pp. 152-156.
Tonti, W. R., "Reliability, Design Qualification, and Prognostic Opportunity of in Die E-Fuse," IEEE Conference on Prognostics and Health Management (PHM), 2011, pp. 1-7.
Ueda, T. et al., "A Novel Cu Electrical Fuse Structure and Blowing Scheme utilizing Crack-assisted Mode for 90-45nm-node and beyond," IEEE VLSI Tech. Sym., Jun. 2006, 2 pages.
Ulman, G. et al., "A Commercial Field-Programmable Dense eFUSE Array Memory with 00.999% Sense Yield for 45nm SOI CMOS", ISSCC 2008/ Session 22 / Variation Compensation and Measurement/ 22.4, 2008 IEEE International Solid-State Circuits Conference, pp. 406-407.
Vimercati, Daniele et al., "A 45nm 1Gbit 1.8V PCM for Wireless and Embedded Applications," IEEE ISSCC Feb. 2010, 26 pages.
Vinson, J. E., "NiCr Fuse Reliability—A New Approach," Southcon/94, Conference Record, 1994, pp. 250-255.
Walko, J., "Ovshinsky's Memories," IEE Review, Issue 11, Nov. 2005, pp. 42-45.
Wang, J. P. et al., "The Understanding of Resistive Switching Mechansim in HfO2-Based Resistive Random Access Memory," IEDM, 2011, pp. 12.1.1-12.1.4.
Wikipedia, "Programmable read-only memory", http://en.wikipedia.org/wiki/Programmable_read-only_memory, downloaded Jan. 31, 2010, 4 pages.
Worledge, D.C., "Single-Domain Model for Toggle MRAM," IBM J. Res. & Dev. vol. 50, No. 1, Jan. 2006, pp. 69-79.
Wu, Kuei-Sheng et al., "The Improvement of Electrical Programmable Fuse with Salicide-Block Dielectrical Film in 40nm CMOS Technology," Interconnect Technology Conference (IITC), 2010 Int. pp. 1-3.
Wu, Kuei-Sheng et al., "Investigation of Electrical Programmable Metal Fuse in 28nm and beyond CMOS Technology," IEEE International Interconnect Technology Conference and 2011 Materials for Advanced Metallization (IITC/MAM), 2011, pp. 1-3.
Yin, M. et al., "Enhancement of Endurance for CuxO based RRAM Cell," 9th Int. Conf. on Solid-State and Integrated-Circuit Technology (ICSICT) 2008, pp. 917-920.
Zhu, Jian-Gang, "Magnetoresistive Random Access Memory: The Path to Competitiveness and Scalability," Proc. of IEEE, vol. 96, No. 11, Nov. 2008, pp. 1786-1798.
Zhuang, W. W. et al., "Novell Colossal Magnetonresistive Thin Film Nonvolatile Resistance Random Access Memory (RRAM)," IEEE IEDM 2002, pp. 193-196.
Notice of Allowance for U.S. Appl. No. 13/026,664 mailed Sep. 18, 2012.
Office Action for U.S. Appl. No. 13/471,704 mailed Jul. 31, 2012.
Notice of Allowance for U.S. Appl. No. 13/471,704 mailed Oct. 18, 2012.
Notice of Allowance for U.S. Appl. No. 13/026,678 mailed Sep. 19, 2012.
Office Action for U.S. Appl. No. 13/026,783 mailed Sep. 27, 2012.
Office Action for U.S. Appl. No. 13/026,717 mailed Oct. 25, 2012.
Office Action for U.S. Appl. No. 13/026,650 mailed Nov. 9, 2012.
Office Action for U.S. Appl. No. 13/026,692 mailed Nov. 9, 2012.
Office Action for U.S. Appl. No. 13/026,752 mailed Nov. 9, 2012.
Office Action for U.S. Appl. No. 13/026,656 mailed Nov. 13, 2012.
Office Action for U.S. Appl. No. 13/026,704 mailed Nov. 23, 2012.
Office Action for U.S. Appl. No. 13/397,673, mailed Dec. 18, 2012.
Office Action for U.S. Appl. No. 13/026,840, mailed Dec. 31, 2012.
Office Action for U.S. Appl. No. 13/026,852, mailed Jan. 14, 2013.
Office Action for U.S. Appl. No. 13/026,783, mailed Sep. 27, 2012.
Restriction Requirement for U.S. Appl. No. 13/026,835, mailed Dec. 12, 2012.
Notice of Allowance for U.S. Appl. No. 13/026,717, mailed Feb. 12, 2013.
Office Action for U.S. Appl. No. 13/471,704 mailed Jan. 25, 2013.
U.S. Appl. No. 13/761,048, filed Feb. 6, 2013.
U.S. Appl. No. 13/761,097, filed Feb. 6, 2013.
U.S. Appl. No. 13/761,045, filed Feb. 6, 2013.
Office Action for U.S. Appl. No. 13/026,678, mailed Feb. 20, 2013.
Notice of Allowance for U.S. Appl. No. 13/026,783, mailed Mar. 4, 2013.
Notice of Allowance for U.S. Appl. No. 13/026,692, mailed Mar. 15, 2013.

(56) References Cited

OTHER PUBLICATIONS

Office Action for U.S. Appl. No. 13/026,704, mailed Nov. 23, 2012.
Notice of Allowance for U.S. Appl. No. 13/026,835, mailed Mar. 20, 2013.
Notice of Allowance for U.S. Appl. No. 13/026,664, mailed Apr. 22, 2013.
Notice of Allowance for U.S. Appl. No. 13/026,656, mailed Apr. 22, 2013.
Jagasivamani et al., "Development of a Low-Power SRAM Compiler", IEEE Press, 2001, pp. 498-501.
Liu et al., "A Flexible Embedded SRAM Compiler", IEEE Press, 2002, 3 pgs.
Sundrararajan, "OSUSPRAM: Design of a Single Port SRAM Compiler in NCSU FREEPDK45 Process", Mater of Science in Electrical Engineering, Oklahoma State University, Jul. 2010, 117 pgs.
Notice of Allowance for U.S. Appl. No. 13/026,835, Mailed Apr. 18, 2013.
Notice of Allowance for U.S. Appl. No. 13/026,704, mailed Apr. 30, 2013.
Notice of Allowance for U.S. Appl. No. 13/026,852, mailed May 10, 2013.
Notice of Allowance for U.S. Appl. No. 13/026,717, mailed May 15, 2013.
Notice of Allowance for U.S. Appl. No. 13/471,704, mailed May 22, 2013.
Notice of Allowance for U.S. Appl. No. 13/026,678, mailed May 28, 2013.
Notice of Allowance for U.S. Appl. No. 13/026,650, mailed May 30, 2013.
Restriction Requirement for U.S. Appl. No. 13/314,444, mailed Jun. 7, 2013.
Restriction Requirement for U.S. Appl. No. 13/214,198, mailed Jun. 13, 2013.
Notice of Allowance for U.S. Appl. No. 13/026,840, mailed Jun. 13, 2013.
Restriction Requirement for U.S. Appl. No. 13/026,771, mailed Jun. 13, 2013.
Notice of Allowance for U.S. Appl. No. 13/026,752, mailed Jul. 1, 2013.
Restriction Requirement for U.S. Appl. No. 13/678,543, mailed Jul. 8, 2013.
Office Action for U.S. Appl. No. 13/026,725, mailed Jul. 19, 2013.
Notice of Allowance for U.S. Appl. No. 13/026,664, mailed Jul. 22, 2013.
Notice of Allowance for U.S. Appl. No. 13/026,692, mailed Jul. 23, 2013.
Notice of Allowance for U.S. Appl. No. 13/397,673, mailed Jul. 30, 2013.
Notice of Allowance for U.S. Appl. No. 13/026,704, mailed Aug. 2, 2013.
Notice of Allowance for U.S. Appl. No. 13/026,783, mailed Aug. 5, 2013.
Office Action for U.S. Appl. No. 13/214,198, mailed Aug. 6, 2013.
Office action for Chinese Patent Application No. 201110279954.7, mailed Jul. 1, 2013.
Shen et al., "High-K Metal Gate Contact RRAM (CRRAM) in Pure 28 nm CMOS Logic Process", Electron Devices Meeting (IEDM), 2012 IEEE International, Dec. 2012, 4 pgs.
Tseng et al., "A New High-Density and Ultrasmall-Cell Size Contact RRAM (CR-RAM) with Fully CMOS-Logic-Compatible Technology and Circuits", IEEE Transactions on Electron Devices, vol. 58, Issue 1, Jan. 2011, 6 pgs.
Office Action for U.S. Appl. No. 13/026,783, mailed Sep. 9, 2013.
Office Action for U.S. Appl. No. 13/314,444, mailed Sep. 9, 2013.
Office Action for U.S. Appl. No. 13/026,771, mailed Sep. 9, 2013.
Notice of Allowance for U.S. Appl. No. 13/026,852, mailed Sep. 18, 2013.
Office Action (Ex Parte) for U.S. Appl. No. 13/678,543, mailed Sep. 20, 2013.
Office Action for U.S. Appl. No. 13/835,308, mailed Sep. 27, 2013.
Notice of Allowance for U.S. Appl. No. 13/026,717, mailed Oct. 1, 2013.
Office Action for U.S. Appl. No. 13/954,831, mailed Oct. 1, 2013.
Notice of Allowance for U.S. Appl. No. 13/026,656, mailed Oct. 4, 2013.
Office Action for U.S. Appl. No. 13/214,183, mailed Oct. 25, 2013.
Chua, "Many Times Programmable z8 Microcontroller", e-Gizmo. cim, Nov. 21, 2006, pp. 1-5.
Forum, Intel Multi-byte Nops, asmcommunity.net, Nov. 21, 2006, pp. 1-5.
CMOS Z8 OTP Microcontrollers Product Specification, Zilog Inc., May 2008, Revision 1, pp. 1-84.
OTP Programming Adapter Product User Guide, Zilog Inc., 2006, pp. 1-3.
Notice of Allowance for U.S. Appl. No. 13/026,852, mailed Nov. 15, 2013.
Notice of Allowance for U.S. Appl. No. 13/026,835, mailed Nov. 22, 2013.
Notice of Allowance for U.S. Appl. No. 13/026,725, mailed Dec. 10, 2013.
Office Action for U.S. Appl. No. 13/026,783, mailed Dec. 23, 2013.
Notice of Allowance for U.S. Appl. No. 13/026,771, mailed Jan. 15, 2014.
Office Action for Chinese Patent Application No. 201110244362.1, mailed Sep. 29, 2013.
Office Action for Chinese Patent Application No. 201110235464.7, mailed Oct. 8, 2013.
Office Action for Chinese Patent Application No. 201110244400.3, mailed Nov. 5, 2013.
Office Action for Chinese Patent Application No. 201110244342.4, mailed Oct. 31, 2013.
Restriction Requirement for U.S. Appl. No. 13/678,541, mailed Feb. 28, 2014.
Notice of Allowance for U.S. Appl. No. 13/026,840, mailed Mar. 6, 2014.
Notice of Allowance for U.S. Appl. No. 13/026,840, mailed Mar. 10, 2014.
Notice of Allowance of U.S. Appl. No. 13/678,543, mailed Dec. 13, 2013.
Notice of Allowance for U.S. Appl. No. 13/835,308, mailed Mar. 14, 2014.
Notice of Allowance for U.S. Appl. No. 13/026,835, mailed Mar. 14, 2014.
Notice of Allowance for U.S. Appl. No. 13/026,725, mailed Mar. 31, 2014.
Notice of Allowance for U.S. Appl. No. 13/026,852, mailed Mar. 20, 2014.
Notice of Allowance for U.S. Appl. No. 13/026,771, mailed Mar. 18, 2014.
Final Office Action for U.S. Appl. No. 13/214,183, mailed Apr. 17, 2014.
"Embedded Systems/Mixed C and Assembly Programming", Wikibooks, Aug. 6, 2009, pp. 1-7.
Notice of Allowance for U.S. Appl. No. 13/761,097, mailed Jul. 15, 2014.
Office Action for U.S. Appl. No. 13/571,797, mailed Apr. 24, 2014.
Restriction Requirement for U.S. Appl. No. 13/678,539, mailed Jul. 1, 2014.
Notice of Allowance for U.S. Appl. No. 14/231,413, mailed Jul. 18, 2014.
Notice of Allowance for U.S. Appl. No. 13/590,044, mailed Jul. 23, 2014.
Restriction Requirement for U.S. Appl. No. 13/833,067, mailed Jul. 11, 2014.
Notice of Allowance for U.S. Appl. No. 13/954,831, mailed Aug. 4, 2014.
Restriction Requirement for U.S. Appl. No. 13/678,544, mailed Aug. 1, 2014.
Notice of Allowance for U.S. Appl. No. 13/761,097, mailed Jul. 25, 2014.
Final Office Action for U.S. Appl. No. 13/314,444, mailed May 14, 2014.

(56) References Cited

OTHER PUBLICATIONS

Corrected Notice of Allowability for U.S. Appl. No. 13/288,843, mailed Aug. 19, 2014.
Office Action for U.S. Appl. No. 13/590,049, mailed Aug. 29, 2014.
Ex Parte Quayle for U.S. Appl. No. 13/590,047, mailed Aug. 29, 2014.
Ex Parte Quayle for U.S. Appl. No. 13/590,050, mailed Sep. 3, 2014.
Office Action for U.S. Appl. No. 13/678,544, mailed Sep. 12, 2014.
Office Action for U.S. Appl. No. 13/678,539, mailed Sep. 10, 2014.
Notice of Allowance for U.S. Appl. No. 13/288,843, mailed Sep. 18, 2014.
Notice of Allowance for U.S. Appl. No. 13/833,044, mailed Sep. 24, 2014.
Notice of Allowance for U.S. Appl. No. 13/314,444, mailed Sep. 24, 2014.
Office Action for U.S. Appl. No. 13/761,045, mailed Sep. 30, 2014.
Notice of Allowance for U.S. Appl. No. 13/835,308, mailed Oct. 10, 2014.
Notice of Allowance for U.S. Appl. No. 13/571,797, mailed Oct. 14, 2014.
Office Action for U.S. Appl. No. 13/833,067, mailed Oct. 20, 2014.
Notice of Allowance for U.S. Appl. No. 14/085,228, mailed Oct. 23, 2014.
Office Action for U.S. Appl. No. 13/842,824, mailed Oct. 29, 2014.

* cited by examiner

CIRCUIT AND SYSTEM FOR TESTING A ONE-TIME PROGRAMMABLE (OTP) MEMORY

CROSS-REFERENCE TO RELATED APPLICATION

This application claims priority benefit of U.S. Provisional Application No. 61/595,170, filed on Feb. 6, 2012 and entitled "CIRCUIT AND SYSTEM FOR TESTING A ONE-TIME PROGRAMMABLE (OTP) MEMORY," which is hereby incorporated herein by reference.

BACKGROUND OF THE INVENTION

One-Time Programmable (OTP) memory is a memory that can be programmed once and only once. An OTP can be programmed from low to high resistance states, the so-called fuse, such as electrical fuse. Alternatively, an OTP can be programmed from high to low resistance states, the so-called anti-fuse. The programming means can apply a high voltage to an OTP element such as in anti-fuse. Alternatively, the programming means can apply a high current to flow through an OTP element such as in fuse. The OTP memory cell usually has a program selector coupled to an OTP element to switch the desirable OTP element to conduct a high current or high voltage applied.

An electrical fuse is a common OTP that can be constructed from a segment of interconnect, such as polysilicon, silicided polysilicon, silicide, metal, metal alloy, or some combination thereof. The metal can be aluminum, copper, other transition metals, or the non-aluminum metal gate for CMOS. One of the most commonly used electrical fuses is a CMOS gate, fabricated in silicided polysilicon, used as interconnect. The electrical fuse can also be one or more contacts or vias instead of a segment of interconnect. A high current may blow the contact(s) or via(s) into a very high resistance state. The OTP element can be an anti-fuse, where a high voltage makes the resistance lower, instead of higher. The anti-fuse can consist of one or more contacts or vias with an insulator in between. The anti-fuse can also be a CMOS gate coupled to a CMOS body with a thin gate oxide as insulator.

A conventional OTP memory cell is shown in FIG. 1. The cell 10 consists of an OTP element 11 and an NMOS program selector 12. The OTP element 11 is coupled to the drain of the NMOS 12 at one end, and to a positive voltage V+ at the other end. The gate of the NMOS 12 is coupled to a select signal (Sel), and the source is coupled to a negative voltage V−. When a high voltage is applied to V+ and a low voltage to V−, the OTP device 10 can be programmed by raising the select signal (Sel) to turn on the NMOS 12. One of the most common OTP elements is a silicided polysilicon, the same material and fabricated at the same time as a MOS gate. The size of the NMOS 12, as program selector, needs to be large enough to deliver the required program current for a few microseconds. The program current for a silicided polysilicon is normally between a few milliamps for a fuse with width of 40 nm to about 20 mA for a fuse with width about 0.6 um. As a result, the cell size of an electrical fuse using silicided polysilicon tends to be very large. The OTP cells 10 are usually organized as a two-dimensional array with all V+'s in the same column coupled together as bitlines (BLs) and all Sel's in the same row coupled together as wordlines (WLs).

Another OTP memory cell 15 is shown in FIG. 1(b). The OTP memory cell has an OTP element 16 and a diode 17 as program selector. The OTP element 16 is coupled between an anode of the diode 17 and a high voltage V+. A cathode of the diode 17 is coupled to a low voltage V−. By applying a proper voltage between V+ and V− for a proper duration of time, the OTP element 16 can be programmed into high or low resistance states, depending on voltage/current and duration. The diode 17 can be a junction diode constructed from a P+ active region on N well and an N+ active region on the same N well as the P and N terminals of a diode, respectively. In another embodiment, the diode 17 can be a diode constructed from a polysilicon structure with two ends implanted by P+ and N+, respectively. The P or N terminal of either junction diode or polysilicon diode can be implanted by the same source or drain implant in CMOS devices. Either the junction diode or polysilicon diode can be built in standard CMOS processes without any additional masks or process steps. The OTP cells 15 can be organized as a two-dimensional array with all V+'s in the same column coupled together as bitlines (BLs) and all Sel's in the same row coupled together as wordline bars (WLBs).

There have been problems in testing OTP memory, since the memory cells can only be programmed and programmed only once. Without programming any cells, reading non-virgin states is impossible. But once the OTP cells are programmed, they cannot be used to store the virgin state. On the other hand, without verifying reading the non-virgin states, the OTP memories may be defected once they are packaged and shifted to customers. Moreover, the peripheral circuits, other than the OTP cells, may be defected too. There should be better methods to test OTP cells in virgin states, non-virgin states, and the associated peripheral circuits.

FIG. 2 shows a block diagram of a portion of an OTP memory 20 according to one of prior arts. The OTP memory 20 has an OTP memory array 21, an additional row 22, and an additional column 23. The additional row 22 or column 23 can be programmed every other cells to check non-virgin states and to generate a stream of logic 0 and 1 states. However, this design needs additional row 22 and column 23 to test cells in non-virgin states, but cannot test the peripheral circuits.

Hence, there is a need for testing, thoroughly and effectively, an OTP memory in virgin states, non-virgin states, and the peripherals to make sure the OTP is fully functional.

SUMMARY

Embodiments of highly effective circuits and systems for testing an OTP memory are disclosed. Embodiments to testing virgin states, non-virgin states, and peripheral circuits are illustrated to exemplify the concepts.

In one embodiment, at least one additional bit is included to be programmed. Once programmed, this bit can be accessed alternatively while reading any virgin cells in the OTP array to show a pseudo-checkerboard pattern or other predetermined pattern. In another embodiment, the wordlines (WLs) and Y-Pass Gates (YPGs) can be enabled or disabled arbitrarily even or odd to show pseudo-checkerboard patterns without programming any cells. In yet another embodiment, multiple reference resistance levels can be selected to test the rough resistance levels of the non-virgin states in a reference branch of a sense amplifier. Much finer resistance distribution can be characterized by sweeping the gate of an MOS sweeping device in the test branch of the sense amplifier in another embodiment.

Embodiments of the invention can be implemented in numerous ways, including as a method, system, device, or apparatus (including graphical user interface and computer readable medium). Several embodiments of the invention are discussed below.

As a One-Time Programmable (OTP) memory, one embodiment can, for example, include at least a plurality of OTP cells, where at least one of the OTP cells includes at least an OTP element with one end coupled to a program selector and another end coupled to a bitline (BL), and a program selector with an enable signal coupled to a wordline (WL). The OTP cells can be organized as a two-dimensional array with the WLs of the OTP cells in the same rows coupled to a WL and the BLs of the OTP cells in the same columns coupled to a BL. The OTP memory can also include at least one sense amplifiers coupled to at least one BLs to generate a logic state, at least one row or column decoders to select one row or one column from the OTP memory, and at least one control signals coupled to the row or column decoders to turn on or off any adjacent rows or columns. Test patterns can be generated with alternative logic 0 and 1 states by setting a combination of the control signals to turn on at least one row or columns through at least one sense amplifiers to read from at least one OTP cells.

As an embodiment in an integrated circuit, one embodiment can, for example, include at least one additional OTP bit that can be programmed arbitrarily. Second, the wordlines or the Y-pass gates can be turned on in even or odd order. If a wordline or Y-pass gate is not turned on, the cell is not selected, which can be embodied as a non-virgin state after reading, according to an OTP memory design. This property can be exploited to generate checkerboard-like and complement checkerboard-like patterns. Third, read performance can be tested with multiple taps of reference resistors to suit difference resistance ranges in the non-virgin states. Finally, the resistance distribution of the OTP cells can be characterized by sweeping the gate of an MOS device, replacing a reference resistor in a test branch, and observing the read outputs. The equivalent resistance of the MOS device can be monitored to know the fine resistance distribution of the OTP cells.

As an electronics system, one embodiment can, for example, include at least a processor, and an OTP memory operatively connected to the processor. The OTP memory can include at least one additional OTP bit that can be programmed arbitrarily. Second, the wordlines or the Y-pass gates can be turned on in even or odd order arbitrarily. If a wordline or Y-pass gate is not turned on, the cell is not selected, which can be embodied as a non-virgin state after reading, according to an OTP memory design. This property can be exploited to generate checkerboard-like and complement checkerboard-like patterns. Third, read performance can be tested with multiple taps of reference resistors to suit difference resistance ranges in the non-virgin states. Finally, the resistance distribution of the OTP cells can be characterized by sweeping the gate of a MOS device, replacing a reference resistor in a test branch, and observing the read outputs. The equivalent resistance of the MOS device can be monitored to know the fine resistance distribution of the OTP cells.

As a method for providing effective embodiments for testing an OTP memory, one embodiment can, for example, include at least one additional OTP bit that can be programmed arbitrarily. Once this additional bit is programmed, accessing the memory array can be multiplexed with accessing this additional bit to generate a pseudo-checkerboard pattern. Second, the wordlines or the Y-pass gates can be turned on in even or odd order arbitrarily. If a wordline or Y-pass gate is not turned on, the cell is not selected, which can be embodied as a non-virgin state after reading, according to an OTP memory design. This property can be exploited to generate checkerboard-like and complement checkerboard-like patterns. Third, read performance can be tested with multiple taps of reference resistors to suit difference resistance ranges in the non-virgin states. Finally, the resistance distribution of the OTP cells can be characterized by sweeping the gate of an MOS device, replacing a reference resistor in a test branch, and observing the read outputs. The equivalent resistance of the MOS device can be monitored to know the fine resistance distribution of the OTP cells.

BRIEF DESCRIPTION OF THE DRAWINGS

The present invention will be readily understood by the following detailed descriptions in conjunction with the accompanying drawings, wherein like reference numerals designate like structural elements, and in which:

FIG. 1($b$) shows another OTP memory cell using diode as program selector.

FIG. 4($b$) shows reading an 8×8-bit OTP memory in a complement checkerboard-like pattern.

DETAILED DESCRIPTION OF EMBODIMENTS OF THE INVENTION

Embodiments of the invention relates to effective circuit and system designs for testing a one-time-programmable (OTP) memory.

Embodiments disclosed herein use innovative methods to test an OTP memory thoroughly. An entire OTP memory can be read in an initial pass to test if all virgin cells can be read as virgin states. Any defects in the OTP elements or program selectors can be detected in the virgin states. But the non-virgin states can still not to be tested. At least one extra OTP cell can be provided as a sample to test programming. After this bit is programmed, reading alternatively between the virgin cells in the memory and the extra bit can generate a pseudo-checkerboard pattern. Reading data in checkerboard pattern can test more defects in the memory cells, because the conditions the cells and peripheral circuit generated in the previous tests can be destroyed so that the memory under test can be more observable. But the shorts between two rows or two columns can still not be detected. Another method is to provide even/odd wordline enables so that any adjacent rows can be enabled or disabled arbitrarily. If there are any shorts between two adjacent wordlines, the read results would be different. By the same token, any adjacent columns can be enabled or disabled by turning on the even or odd Y-Pass Gate enables arbitrarily. If there are any shorts between two adjacent bitlines (BLs) in any columns, the read results would be different. By combining the row/column enables, another checkerboard-like and complement checkerboard-like patterns can be generated.

Read can be tested with multiple reference resistors in the reference branch of at least one sense amplifiers upon select. Programming an OTP cell can result in wide resistance spread, depending on the program conditions, such as process, temperature, and voltage. A plurality (e.g. 4) of reference resistance levels can be selected by two extra pins to suit different resistance ranges of the non-virgin states. But to understand the behavior of OTP cells, either programmed or not, much more accurate resistance distribution should be characterized. The reference resistor can be replaced by a MOS upon select in a test branch of a sense amplifier. By sweeping the gate of the MOS, a continuous reference resistance can be generated to test the OTP cells. By observing the output of the sense amplifier when the states are changed, the equivalent resistance of the MOS device matches the resistance of the OTP cell under test. The equivalent resistance of the MOS device can be calibrated by monitoring the voltage or current of this device during sweeping.

Figure 1A:
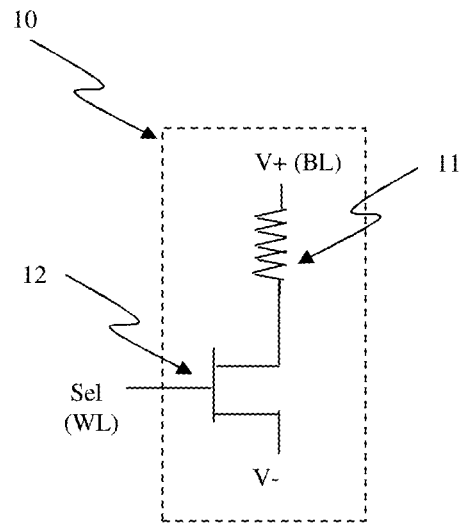
FIG. 1($a$) shows a conventional OTP memory cell using MOS as program selector according to a prior art.
Figure 1B:
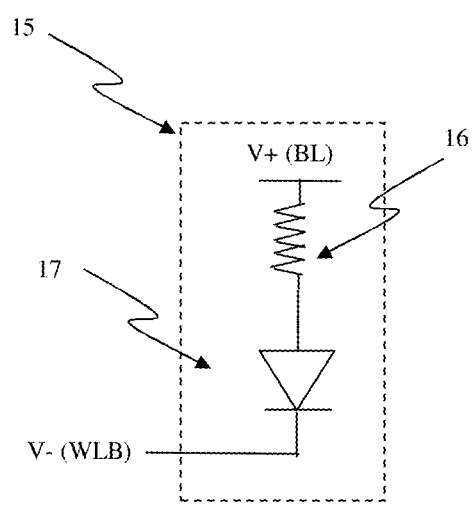
Figure 2:
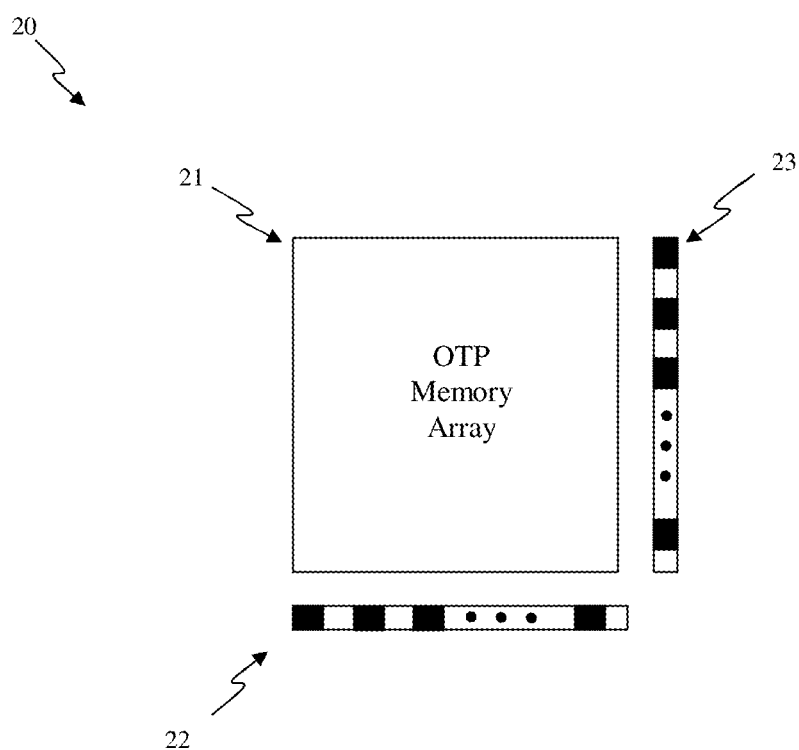
FIG. 2 shows a block diagram of testing an OTP with additional row/column according to a prior art.
Figure 3:
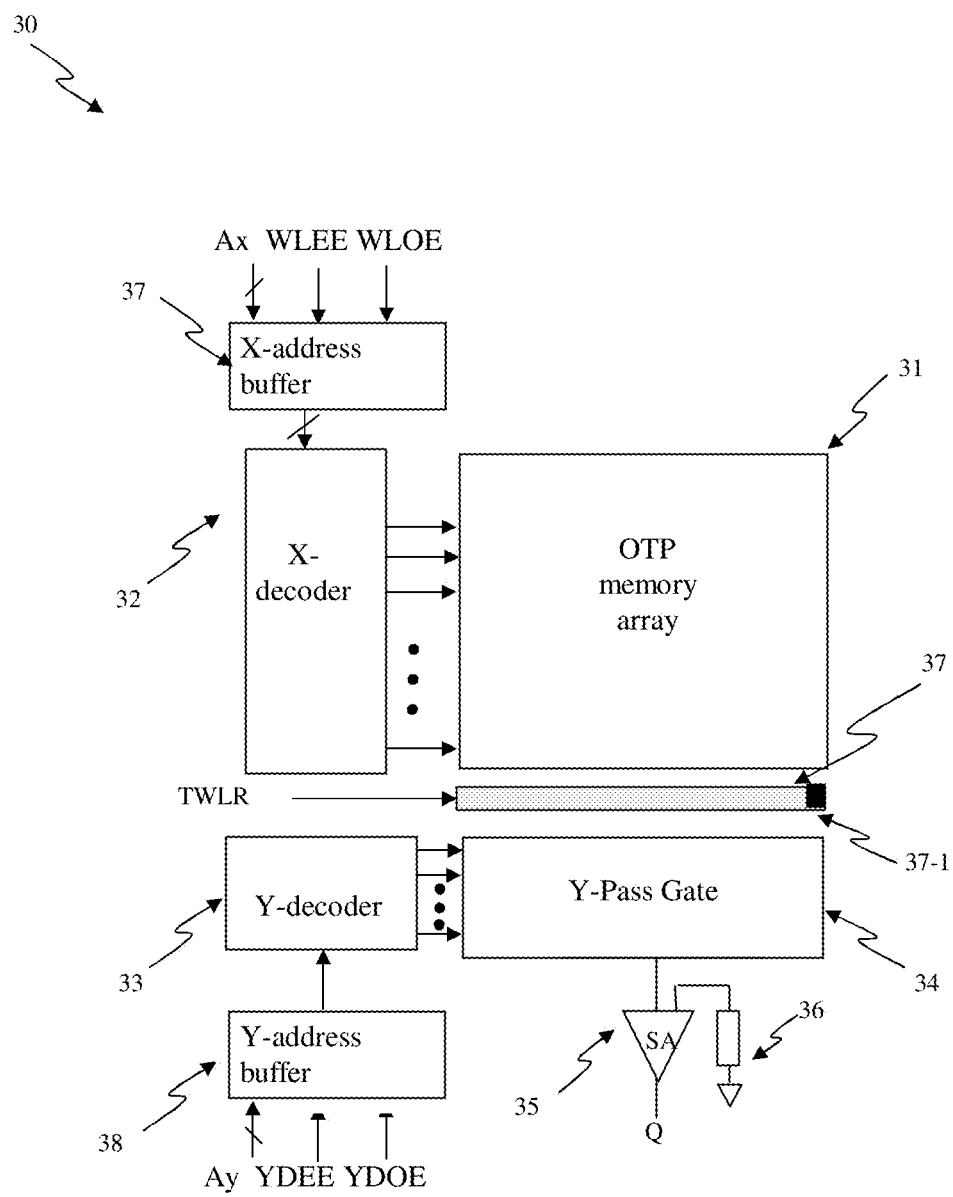
FIG. 3 shows a block diagram of a portion of an OTP memory according to one embodiment.

FIG. 3 shows a block diagram of one embodiment of a portion of an OTP memory 30 according to one embodiment. The OTP memory 30 has an OTP memory array 31, an X-decoder 32, a Y-decoder 33, an additional row 37, a plurality of Y-Pass Gates (YPG) 34, a sense amplifier 35, reference/test branch 36, an X-address buffer 37, and a Y-address buffer 38. A set of X-addresses (Ax) is coupled to the input of the X-address buffer 37 that are further coupled to an X-decoder 32 to generate wordlines to access a row in an OTP memory array 31. WLEE/WLOE (Word Line Even/Odd Enable) can be used to enable even or odd wordlines upon assertion. WLEE/WLOE can be coupled to the X-address buffer 37 or to the X-decoder 32 directly. Similarly, a set of Y-addresses (Ay) is coupled to the input of the Y-address buffer 38 that is further coupled to the Y-decoder 33 to generate Y-Pass Gate selects to access at least one column in the OTP memory array 31. YDEE/YDOE (Y-Decoder Even/Odd Enable) can be used to enable even or odd Y-Pass Gate selects upon assertion. YDEE/YDOE can be coupled to the Y-address buffer 38 or to the Y-decoder 33 directly. The additional row 37 has at least one OTP cell 37-1 that can be programmed for test. This additional row 37 can be enabled by a signal TWLR. The extra bit 37-1 can be integrated into the OTP memory array 31 or as a stand-alone bit in other embodiments. After one of the wordlines and Y-Pass Gate selects are turned on, the cell data can be coupled to the input of a sense amplifier (SA) 35. The SA has a reference/test branch 36 to generate a reference resistance to be compared with the resistance in the OTP cells to determine a logic state.

For an OTP memory, if both the wordline (WL) and Y-Pass Gate (YPG) are turned on, a program selector can be turned on so that the resistance state of the OTP element can be sensed and read. The virgin state of a fuse OTP is a low resistance state such that the voltage for sense can be low, or logic 0. Alternatively, the virgin state of an anti-fuse OTP is a high resistance state such that the voltage for sense can be high, or logic 1. If the WL is disabled, so is the presumably selected program selector such that the BL signal for sensing is floating. If the BLs are designed with pullups for fuse OTP memory, the data sensed can be logic 1, if the YPG is enabled. Similarly, if the BLs are designed with pulldowns for anti-fuse OTP memory, the data sensed can be logic 0. Those states are opposite to the virgin states. By the same token, if an YPG is disabled, the output of the YPG can be floating. If the outputs of the YPGs are coupled to high or low for fuse or anti-fuse, respectively, the data sensed can be non-virgin states for either fuse or anti-fuse, when YPGs are disabled. By doing this way, either disabled WLs or YPGs can generate seemingly non-virgin states for testing.

Figure 4A:
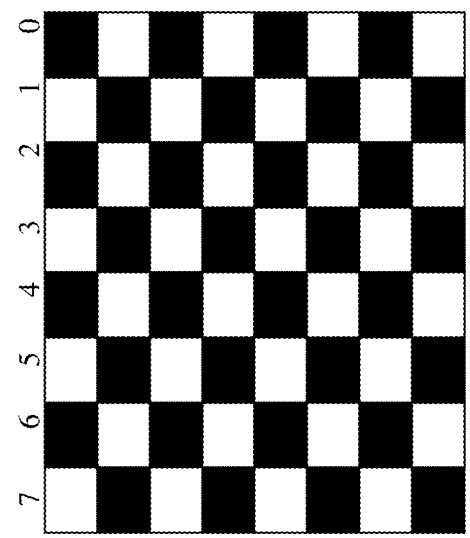
FIG. 4($a$) shows reading an 8×8-bit OTP memory in a checkerboard-like pattern.

FIG. 4(a) shows an 8×8 OTP memory array read as checkerboard-like pattern 51 according to one embodiment. Let each black box represent a non-virgin state. If the read pattern goes from (x,y)=(0,0) in the upper left cell to the cells in the right in the same row, and then to the next row going from left to right to access the cells (i,j), a checkerboard-like pattern can be generated by setting WLEE=0 or YDEE=0 when i+j is even, and WLEE=1 and YDEE=1 when i+j is odd, while WLOE and YDOE are complement to WLEE and YDEE, respectively, if not specified. To test if there are any WLs shorted to each other, it is better to set WLEE=0 for even i+j and WLEE=1 for odd i+j in one pass, while WLOE is opposite to WLEE and YDEE=YDOE=1. To test if there are any BLs shorted to each other, it is better to set YDEE=0 for even i+j and YDEE=1 for odd i+j in another pass, while YDOE is opposite to YDEE and WLEE=WLOE=1. Another two passes can be tested by going through the column direction first.

Figure 4B:
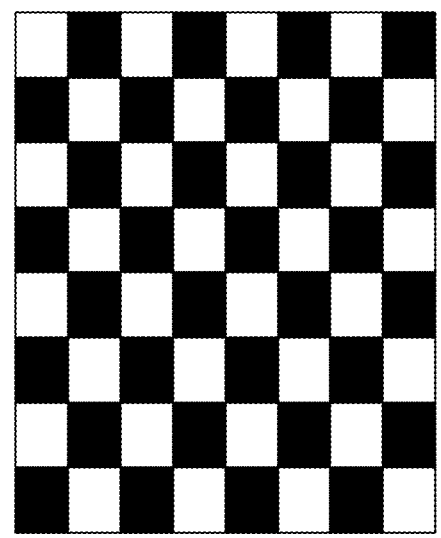

FIG. 4(b) shows an 8×8 OTP memory array read as a complement checkerboard-like pattern 51 according to one embodiment. Let each black box represent a non-virgin state. If the read pattern goes from (x,y)=(0,0) in the upper left cell to the cells in the right in the same row, and then to the next row going from left to right to access the cells (i,j), a complement checkerboard-like pattern can be generated by setting WLEE=0 or YDEE=0 when i+j is odd, and WLEE=1 and YDEE=1 when i+j is even, while WLOE and YDOE are complement to WLEE and YDEE, respectively, if not specified. To test if there are any WLs shorted to each other, it is better to set WLEE=0 for odd i+j and WLEE=1 for even i+j in one pass, while WLOE is opposite to WLEE and YDEE=YDOE=1. To test if there are any BLs shorted to each other, it is better to set YDEE=0 for odd i+j and YDEE=1 for even i+j in another pass, while YDOE is opposite to YDEE and WLEE=WLOE=1. Another two passes can be tested by going through the column direction first.

Figure 5:
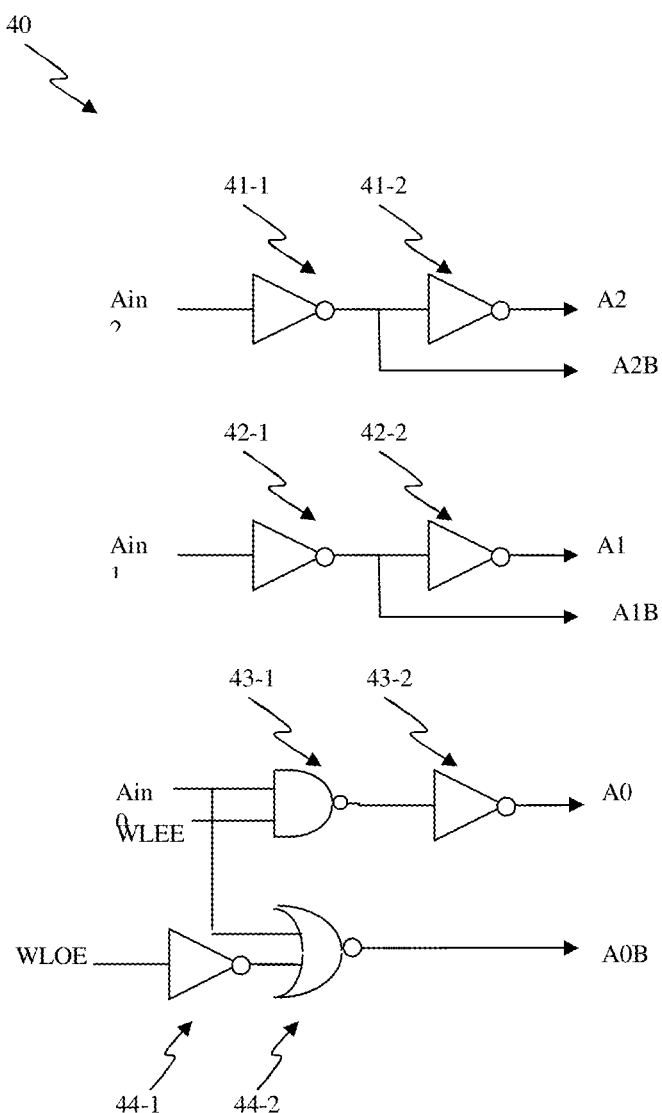
FIG. 5 shows a schematic of address buffers with even/odd wordline enable signals, according to one embodiment.

FIG. 5 shows a schematic of a portion of an address buffer 40 with Wordline Even/Odd Enables (WLEE/WLOE) according to one embodiment. Address input Ain2 is coupled to an input of an inverter 41-1, which has the output coupled to an input of another invert 41-2. The output of the both inverters 41-1 and 41-2 are A2B and A2, respectively. Similarly the address input Ain1 is coupled to an input of an inverter 42-1, which has the output coupled to an input of another invert 42-2. The output of the both inverters 42-1 and 42-2 are A1B and A1, respectively. The A0 needs to be low when WLEE is low no matter what Ain0 is and A0B needs to be low when WLOE is low no matter what Ain0 is. Address Ain0 is coupled to a NAND 43-1 whose output is coupled to an inverter 43-2 to generate A0. The other input of the NAND 43-1 is coupled to WLEE so that the A0 can be low whenever WLEE is low. Address Ain0 is coupled to a NOR 44-2 to generate A0B in the output. The other input of NOR 44-2 is coupled to WLOE through an inverter 44-1. The A0B can be low whenever WLOE is low. In other embodiments, the WLEE and WLOE can be coupled to X-predecoder or X-decoder directly. YDEE and YDOE can be embodied in an Y-address buffer in a similar manner.

Figure 6:
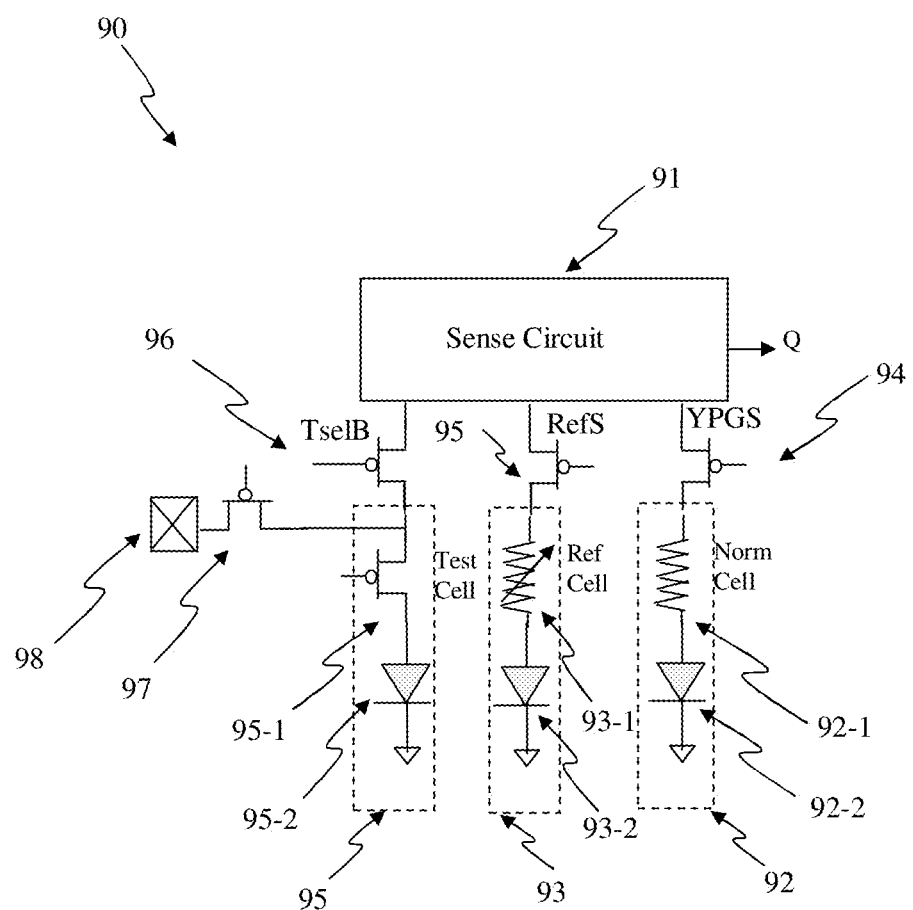
FIG. 6 shows a block diagram of a sense amplifier with normal, reference, and test branches, according to one embodiment.

FIG. 6 shows a portion of a sense amplifier 90 according to one embodiment. A sense circuit 91 can be used to compare the resistances in any two resistance branches. One branch can be the normal cell branch that has a Y-Pass Gate 94, controlled by YPGS, and a normal cell 92, which has an OTP element 92-1 and a diode as program selector 92-2. The normal cell 92 can be physically integrated into an OTP cell array. The other branch can be a reference cell branch that has a reference pass gate 95, controlled by Reference Select (RefS), coupled to a reference cell 93. The reference cell 93 has at least one reference resistance 93-1 coupled to a reference diode 93-2. To sense the resistance of an OTP element in an OTP cell, both YPGS and RefS are turned on and the sense circuit 91 is activated, so that an output Q can be generated as logic 0 or 1, depending if the resistance of the OTP element in the selected cell is lower or higher than the resistance in the reference cell. By adjusting the reference resistance 93-1 to about resistance half-way between virgin and programmed states, the sense amplifier 90 can operate in an optimal way.

The reference branch can only determine if the data is logic 0 or 1, and cannot indicate the resistance of a selected OTP cell in fine resolution. Another branch, test branch, can be used to characterize the resistance in an OTP cell, either programmed or not. The test branch has a test pass-gate 96, controlled by Test Select Bar (TselB), coupled to a test cell 95. The test cell has a MOS device, with gate coupled to Tsweep, which is further coupled to a test diode 95-2. The test diode 95-2 can be shared with the reference diode 93-2 in the other embodiment. By sweeping the signal Tsweep while activating the sense circuit, the output Q can be monitored for any state changes. The equivalent resistance of the MOS 95-1 is the resistance of the OTP cell, when Q changes states. The test branch can be calibrated by turning on another MOS 97 coupled to a test output pad 98 to measure the voltage on the pad 98 when Tsweep is sweeping. The equivalent resistance of the MOS 95-1 can be calculated from the voltage on pad 98 accordingly.

Figure 7:
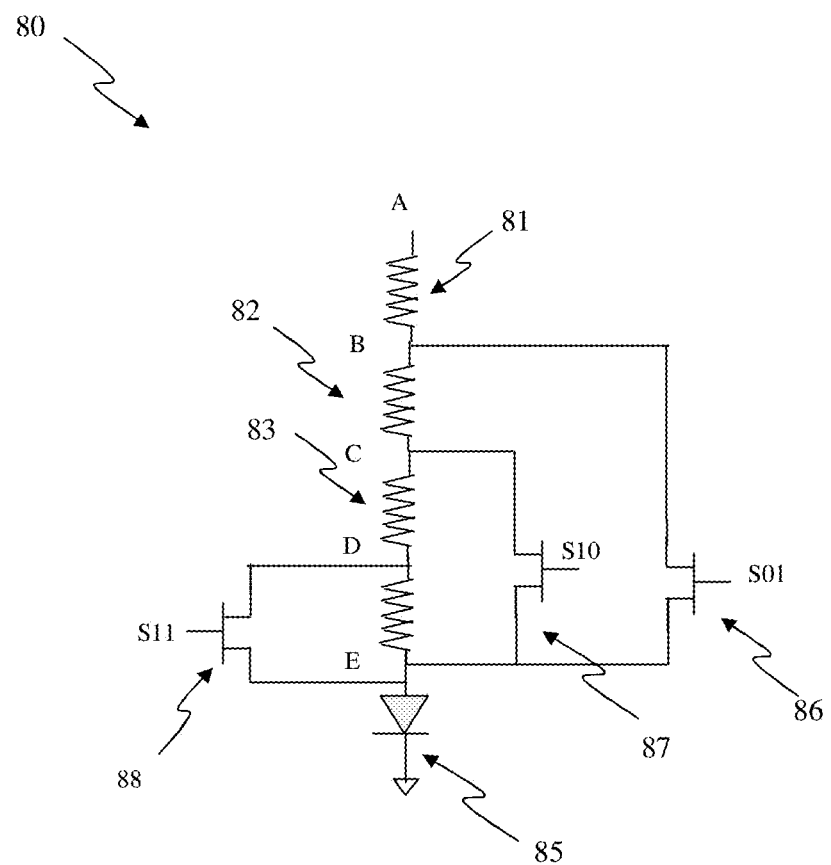
FIG. 7 shows a schematic of a reference resistor network in the reference branch, according to one embodiment.

FIG. 7 shows a schematic of one embodiment of reference cell 80 according to one embodiment. The reference cell 80 has a node A, through a resistor 81, coupled to node B, which through another resistor 82 coupled to node C. Node C, through a resistor 83, is coupled to node D, which, through another resistor 84, is coupled to node E and then to a reference diode 85. There are three MOS 86, 87, and 88 acting as switches coupled between node B, C, and D to node E to short the two source/drain nodes when on, respectively. Their gates are coupled to S01, S10, and S11, respectively. By turning on MOS 86 only while turning off MOS 87 and 88, the resistance between A and E is only the resistor 81, while the other resistors are shunt to very low resistance. By turning on MOS 87 only while turning off MOS 86 and 88, the resistance between A and E is only the resistors 81 and 82 in serial, while the other resistors are shunt to very low resistance. By turning on MOS 88 only while turning off MOS 86 and 87, the resistance between A and E are only resistor 81, 82, and 83 in serial, while the resistor 84 is shunt to a very low resistance. In other words, the resistance between node A and E can be adjusted by selecting the MOS switches, S01, S10, or S11, to shunt the corresponding resistors. The MOS switch devices 86, 87, or 88 can be PMOS devices in other embodiments. The gate control signals can be fully decoded or not. The reference diode 85 can be shared with the test diode in the test branch. The connectivity of the resistors and the test diode can be interchangeable. The above discussions for FIGS. 6 and 7 are for illustrative purposes. There are many equivalent circuits and configurations for embodiments and that are still within the scope of this invention.

Figure 8:
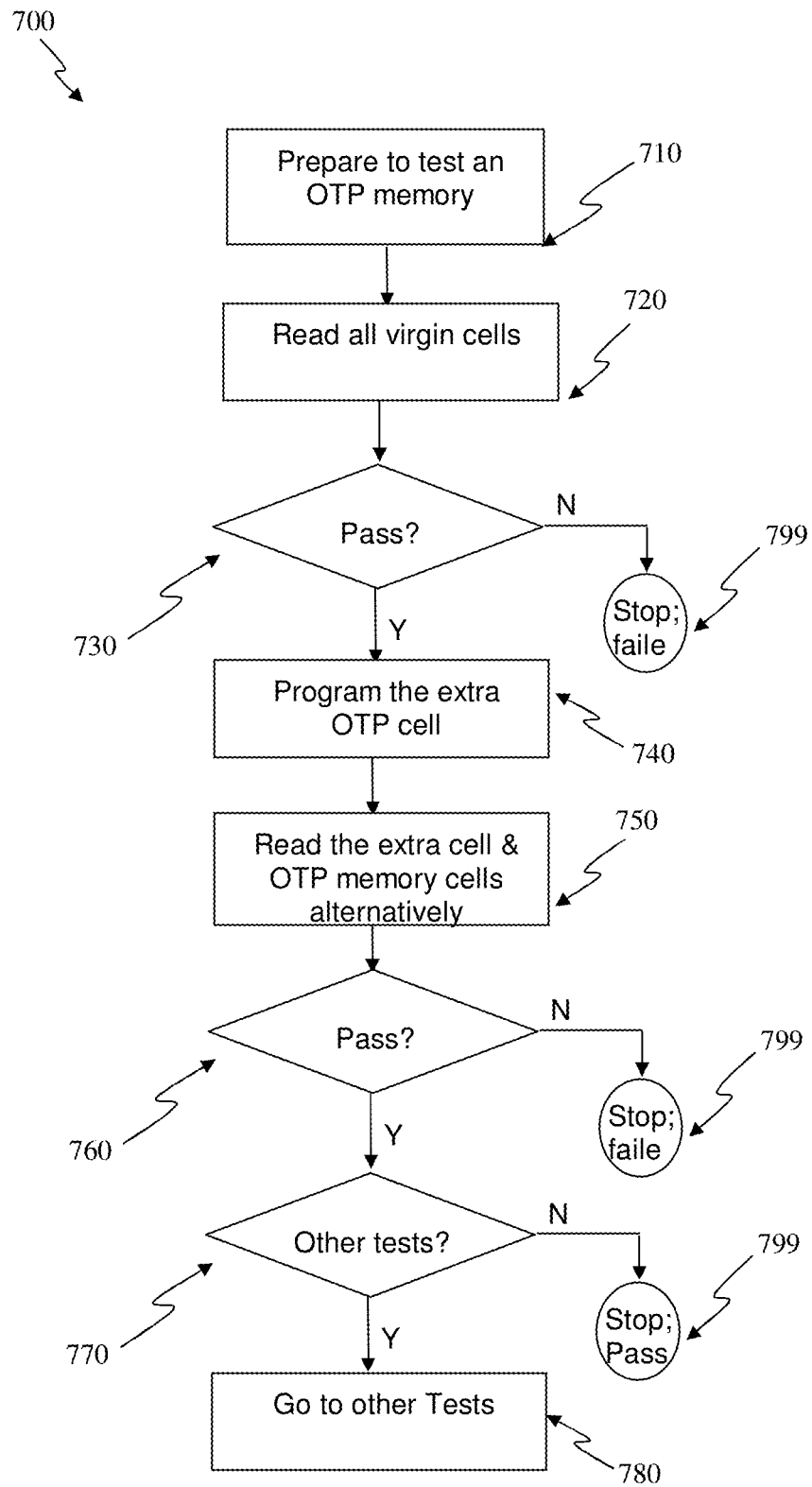
FIG. 8 depicts a method in a flow chart to test an OTP in pseudo-checkerboard pattern according to one embodiment.

FIG. 8 shows a flow chart 700 depicting embodiments of a method for testing an OTP memory before actual programming. This test module is for testing initial virgin states and a pseudo-checkerboard pattern by programming at least one extra bit and reading alternatively between the extra bit and the virgin OTP cells. The procedure starts at 710 to prepare testing an OTP memory with proper reference resistance set. Firstly, read all virgin cells in 720. And then check if all cells pass in 730. If no, the test stops at 799 with a fail. If yes, program at least one extra OTP cell as a sample to create a non-virgin state in 740. Then read the extra cell and the memory cells alternatively to show a pseudo-checkerboard pattern in 750. Check if the test passes in 760. If no, the test stops at 799 with a fail. If yes, check if other tests are needed in 770. If no, the test stops with a pass in 799. If yes, go to other tests in 780.

Figure 9:
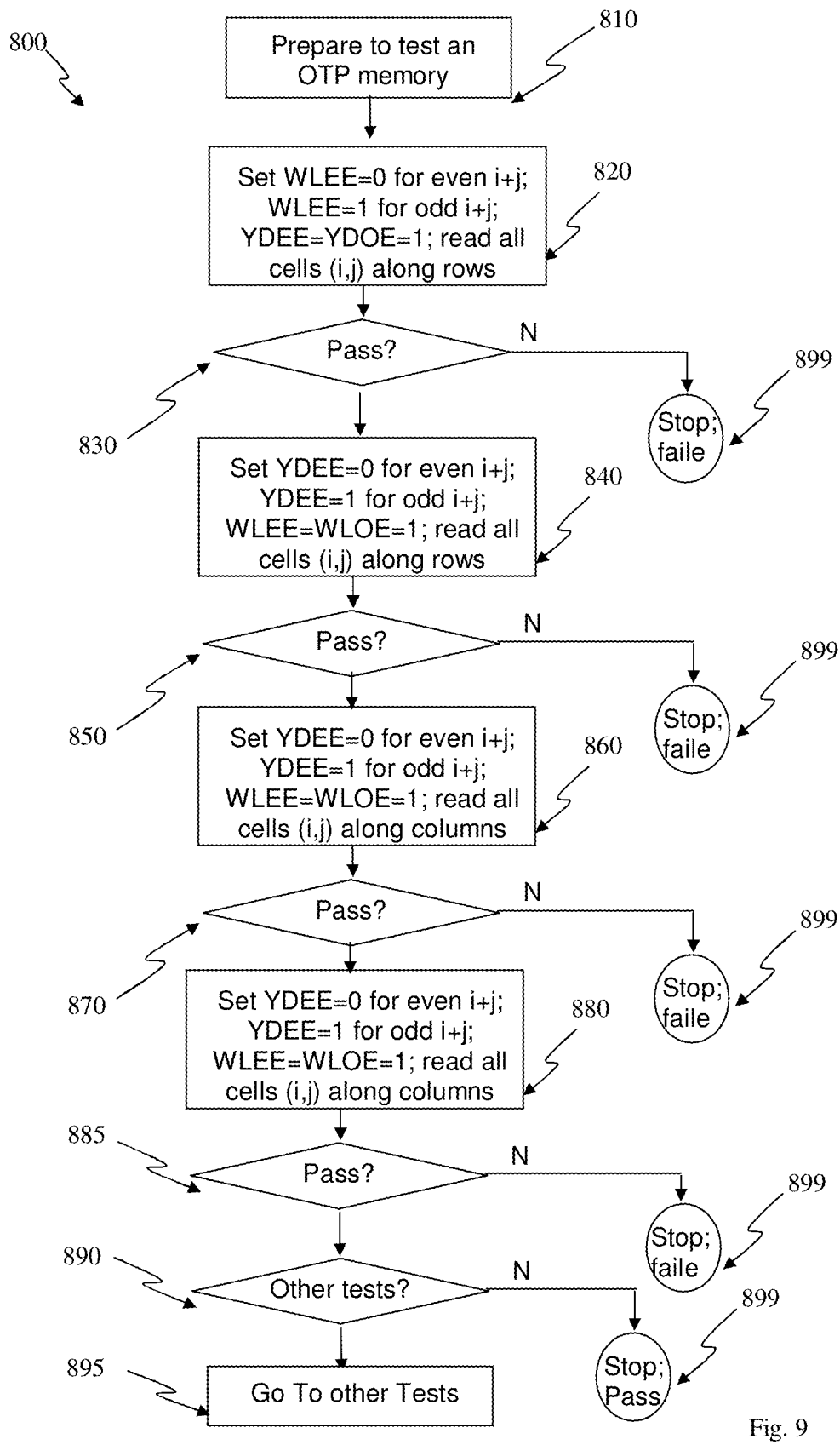
FIG. 9 depicts a method in a flow chart to test an OTP in checkerboard-like patterns according to one embodiment.

FIG. 9 shows a flow chart 800 depicting another embodiment of a method for testing an OTP memory before actual programming. This test module is for generating checkerboard-like patterns by using combinations of WLEE, WLOE, YDEE, and YEOE signals. The test starts at 810 by providing proper settings for an OTP memory such as a suitable reference resistance. Then, read all cells, (i, j), in the OTP memory starts with the lowest X and Y addresses (0,0) and runs in row directions by setting WLEE=0 for even i+j cells, WLEE=1 for odd i+j cells, and WLEO=~WLEE, YDEE=YDOE=1 in step 820. Check if the test passes in 830. If no, stop the test with a fail in 899. If yes, read all cells, (i, j), in the OTP memory starts with the lowest X and Y address (0, 0) and runs in row directions by setting YDEE=0 for even i+j cells and YDEE=1 for odd i+j cells, and YDEO=~YDEE, WLEE=WLOE=1 in step 840. Check if the test passes in step 850. If no, stop the test in 899 with a fail. If yes, do the same test as in step 820 but in column directions in step 860. Check if the test passes in step 870. If no, the test stops at 899 with a fail. If yes, do the same test as in step 840 but in column directions in step 880. Check if the test passes in step 885. If no, the test stops at 899 with a fail. If yes, check if other tests are needed in step 890. If no, the test stops with a pass. If yes, go to other tests in 895. The signals WLOE or YDOE are set to the complements of WLEE or YDEE, respectively, if not specified.

The flow chart shown in FIG. 9 is to test 4 passes of checkerboard-like patterns by proper settings of WLEE, WLOE, YDEE, and YDOE. The same flow chart can be applied to test 4 passes of complement checkerboard-like patterns by reversing the polarities of the enable signals, such as WLEE, WLOE, YDEE, and YDOE, for even i+j and odd i+j. There are other combinations of checkerboard-like patterns, such as setting low at the same time for more than one of the 4 enable signals WLEE, WLOE, YDEE, and YDOE, or to generate stripe-like patterns. There are many variations and equivalent embodiments of test patterns can be generated and those are all within the scope of various embodiments.

Figure 10:
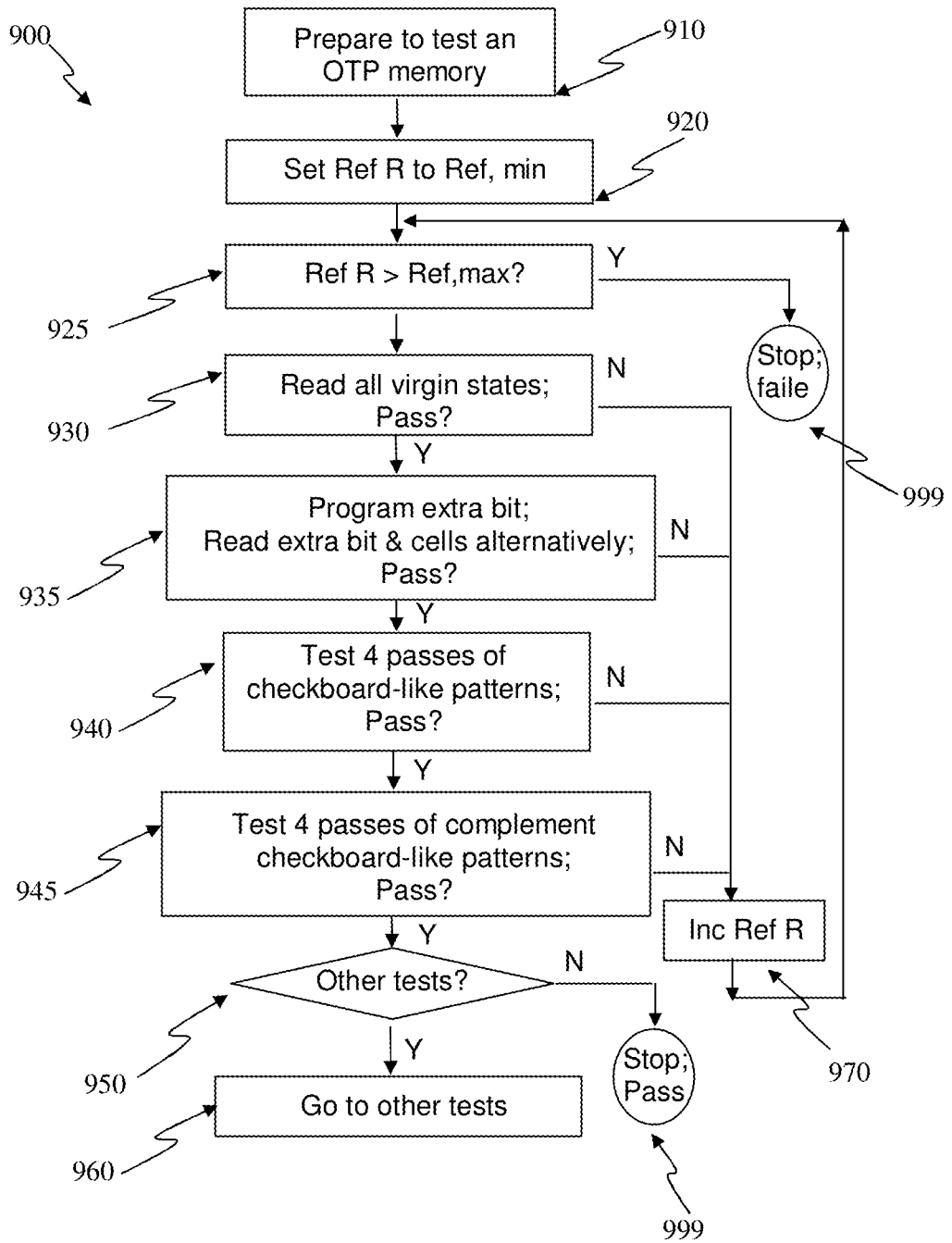
FIG. 10 depicts a method in a flow chart to test an OTP in some combinations with different reference resistance setting according to one embodiment.

FIG. 10 shows a flow chart 900 depicting embodiments of a method for testing an OTP memory before actual programming. This test module is a combination of proper reference resistance settings, initial virgin state test, a pseudo-checkerboard pattern by programming at least one extra bit and reading alternatively between the extra bit and OTP cells, and doing checkerboard-like and complement checkerboard-like tests by proper settings of WLEE, WLOE, YDEE, and YDOE. The test starts at 910 with proper control signals ready for an OTP memory. Then, set the reference resistance to the lowest level, Ref, min in 920. Check if the reference resistance is higher than the allowed maximum value, Ref, max in 925. If yes, stop the test in 995 with a fail. If no, read all virgin states in 930 and check if passes. If no, goes to step 970 to increment the Ref to the next higher level. If yes, program at least one extra bit and read the extra bit and the OTP cells alternatively in 935 and check if passes. If no, goes to step 970. If yes, test 4 passes of checkerboard-like patterns as depicted in FIG. 9 and check if passes in 940. If no, goes to step 970. If yes, test 4 passes of complement checkerboard-like patterns, similar to the method in FIG. 9, and check if passes in 945. If no, goes to step 970. If yes, check if any other tests are needed in 950. If no, the test stops with a pass in 999, otherwise go to other tests in 960. As for step 970, the reference resistance is increased to a higher level and goes to 925 to continue testing until the reference resistance exceeds the highest level allowed in 925.

The flow charts shown in FIGS. 8, 9. 10 depicting embodiments of various test methods 700, 800, and 900 for testing an OTP memory in accordance with certain embodiments. The methods 700, 800, and 900 are described in the context an OTP memory, such as the OTP memory 31 in FIG. 3. In addition, although described as a flow of steps, one of ordinary skilled in the art will recognize that at least some of the steps may be performed in a different order, including simultaneously, or skipped.

The discussions of checkerboard-like or pseudo-checkerboard test patterns are for illustration purposes. The numbers of cells in a row or column can be arbitrarily. The row and column are interchangeable. There can be more or less than the 4 enables signals, such as WLEE, WLEO, YDEE, or YDOE, for controlling wordline or bitline pass gates. The access sequences can be row-wise, column-wise, or in any order. The memory access order can be ascending, descending, or in any order. The test patterns can be checkerboard, strip, or block patterns. With the introducing of "1" cells before actual programming, the general test patterns, such as match, scan, scanning diagonal, or butterfly can be generated accordingly. There are many variations and equivalent embodiments of this invention and they are all within the scope of various embodiments.

Figure 11:
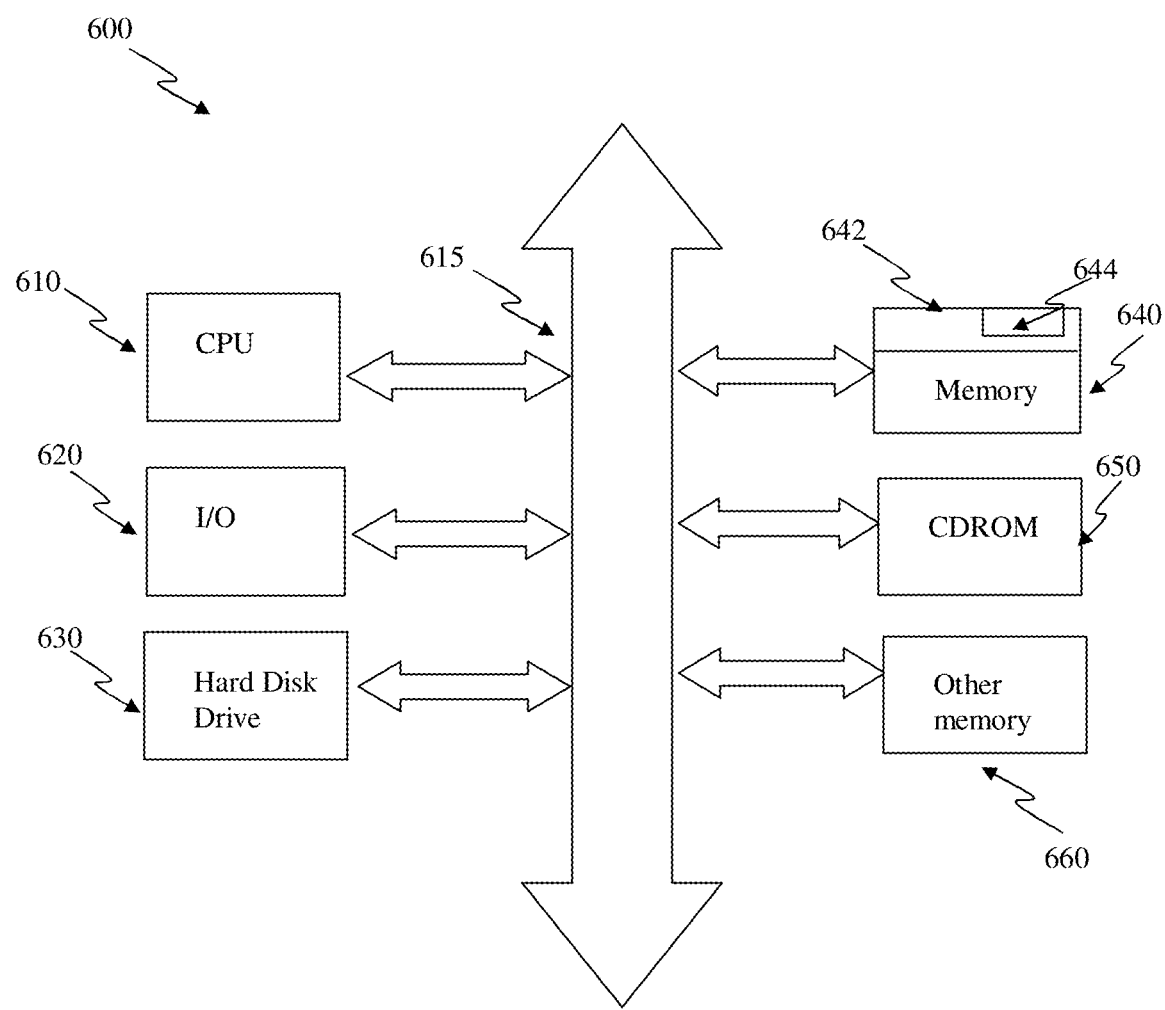
FIG. 11 shows a processor system using OTP memory according to one embodiment.

FIG. 11 shows a processor system 600 according to one embodiment. The processor system 600 can include an OTP device 644, such as in a cell array 642, in OTP memory 640, according to one embodiment. The processor system 600 can, for example, pertain to a computer system. The computer system can include a Central Process Unit (CPU) 610, which communicate through a common bus 615 to various memory and peripheral devices such as I/O 620, hard disk drive 630, CDROM 650, OTP memory 640, and other memory 660. Other memory 660 is a conventional memory such as SRAM, DRAM, or flash, typically interfaces to CPU 610 through a memory controller. CPU 610 generally is a microcontroller, microprocessor, a digital signal processor, or other programmable digital logic devices. Memory 640 is preferably constructed as an integrated circuit, which includes the memory array 642 having at least one OTP device 644. The memory 640 typically interfaces to CPU 610 through a memory controller. If desired, the memory 640 may be combined with the processor, for example CPU 610, in a single integrated circuit.

Embodiments can be applied to any OTP memory that has OTP cells including a OTP element coupled to at least one program selectors. The OTP element can be a fuse or anti-fuse. The fuse can be an interconnect fuse or a single or plural of contact/via fuse. The interconnect fuse can include polysilicon, silicided polysilicion, silicide, polymetal, metal, metal alloy, thermally isolated active region, or some combinations thereof. One of the most common fuse is a CMOS gate used as an interconnect. The anti-fuse can be a contact/via with dielectric in between, or a CMOS gate coupled to a CMOS body with gate oxide in between. A diode can be used as program selector. The diode can be a junction diode constructed from a P+ active region on N well and an N+ active region in the same N well as the P and N terminals of the diode, respectively. In another embodiment, a diode can be constructed from a polysilicon structure with two ends implanted by P+ and N+ implants, respectively, In yet another embodiment, the diode can be an isolated active region with two ends implanted by P+ and N+ implants, respectively. The P or N terminal of junction, polysilicon, or active region diode can be implanted by the same source or drain implant in CMOS devices. Either the junction diode, polysilicon diode, or active region diode can be built in standard CMOS processes without any additional masks or process steps.

Embodiments can be implemented in a part or all of an integrated circuit in a Printed Circuit Board (PCB), or in a system. The OTP memory device can be fuse, (such as interconnect, contact, or via fuse) or anti-fuse. The interconnect fuse can be silicided or non-silicided polysilicon fuse, metal fuse, or thermally isolated active region fuse. The anti-fuse can be a gate-oxide breakdown anti-fuse, contact or via anti-fuse with dielectrics in-between. Though the program mechanisms are different, their logic states can be distinguished by different resistance values and can only be programmed once.

Additional information on programmable memory structures and their formation and usage can be found in: (1) U.S. patent application Ser. No. 13/026,650, filed on Feb. 14, 2011 and entitled "CIRCUIT AND SYSTEM FOR USING A POLYSILICON DIODE AS PROGRAM SELECTOR FOR RESISTIVE DEVICES IN CMOS LOGIC PROCESSES," which is hereby incorporated herein by reference; (2) U.S. patent application Ser. No. 13/026,725, filed on Feb. 14, 2011 and entitled "CIRCUIT AND SYSTEM FOR USING A JUNCTION DIODE AS PROGRAM SELECTOR FOR RESISTIVE DEVICES," which is hereby incorporated herein by reference; (3) U.S. patent application Ser. No. 13/026,725, filed on Feb. 14, 2011 and entitled "CIRCUIT AND SYSTEM OF USING JUNCTION DIODE AS PROGRAM SELECTOR FOR RESISTIVE DEVICES IN CMOS LOGIC PROCESSES," which is hereby incorporated herein by reference; (4) U.S. patent application Ser. No. 13/026,650, filed on Feb. 14, 2011 and entitled "CIRCUIT AND SYSTEM OF USING POLYSILICON DIODE AS PROGRAM SELECTOR FOR RESISTIVE DEVICES IN CMOS LOGIC PROCESSES," which is hereby incorporated herein by reference; and (5) U.S. patent application Ser. No. 13/471,704, filed on May 15, 2012 and entitled "CIRCUIT AND SYSTEM FOR USING A JUNCTION DIODE AS PROGRAM SELECTOR FOR ONE-TIME PROGRAMMABLE DEVICES," which is hereby incorporated herein by reference.

The above description and drawings are only to be considered illustrative of exemplary embodiments, which achieve the features and advantages of the present invention. Modifications and substitutions of specific process conditions and structures can be made without departing from the spirit and scope of the present invention.

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A One-Time Programmable (OTP) memory, comprising:
   a plurality of OTP cells, at least one of the OTP cells comprising:

a program selector with an enable signal coupled to a wordline (WL);

an OTP element with one end coupled to the program selector and another end coupled to a bitline (BL); and the OTP cells being organized as a two-dimensional array with the WLs of the OTP cells in the same rows coupled to a WL and the BLs of the OTP cells in the same columns coupled to a BL;

at least one sense amplifier coupled to at least one BLs to generate a logic state;

at least one row or column decoders to select one row or one column from the OTP memory; and at least one control signal coupled to the row or column decoders to turn on or off any adjacent rows or columns, wherein test patterns are be generated with alternative logic 0 and 1 states by setting a combination of the control signals to turn on at least one row or columns through at least one sense amplifiers to read from at least one OTP cells.

2. An OTP memory as recited in claim 1, wherein the control signals are coupled to at least one address buffers are coupled to a row or column decoder.

3. An OTP memory as recited in claim 1, wherein the sense amplifier has a plurality of reference resistors for selection.

4. An OTP memory as recited in claim 1, wherein the sense amplifier has a test device that has a control signal to sweep the device into different resistance values, wherein the equivalent resistance of the device is used as a test reference resistance to sense the OTP cells.

5. A sense amplifier as recited in claim 4, wherein the test device can be monitored for voltage or current during sweep tests.

6. An OTP memory as recited in claim 1, wherein the OTP element is a fuse that includes at least one of polysilicon, silicided polysilicon, silicide, polymetal, metal, metal alloy, thermally isolated active region, CMOS gate, contact, or via.

7. An OTP memory as recited in claim 1, wherein the OTP element is an anti-fuse that includes at least one of contact/via with dielectric in between gate and MOS body with gate oxide in between.

8. An OTP memory as recited in claim 1, wherein at least one of the OTP cells has at least one program selector that is a junction diode constructed from an isolated active region on a CMOS well, and wherein the two terminals of the junction diode are implanted with the same source or drain implant in a CMOS process.

9. An OTP memory as recited in claim 1, wherein at least one of the OTP cells have at least one program selector that is a polysilicon or isolated active-region diode built on a polysilicon or isolated active-region structure, and wherein the two terminals of the diode are implanted with the same source or drain implant in a CMOS process.

10. An electronics system, comprising:
a processor; and
an OTP memory operatively connected to the processor, the OTP memory includes at least a plurality of OTP cells for providing data storage, each of the OTP cells comprising:
a program selector with an enable signal coupled to a wordline (WL);
an OTP element with one end coupled to the program selector and another end coupled to a bitline (BL); and
the OTP cells being organized as a two-dimensional array with the WLs of the OTP cells in the same rows coupled to a WL and the BLs of the OTP cells in the same columns coupled to a BL;

at least one sense amplifier coupled to at least one BLs to generate a logic state;

at least one row or column decoders to select one row or one column from the OTP memory; and at least one control signal coupled to at least one row or column decoders to turn on or off any adjacent rows or columns, wherein test patterns are be generated with alternative logic 0 and 1 states by setting a combination of the control signals to turn on at least one row or columns through at least one sense amplifiers to read from at least one OTP cells.

11. An OTP memory as recited in claim 10, wherein the control signals are coupled to at least one address buffer coupled to a row or column decoder.

12. An OTP memory as recited in claim 10, wherein the sense amplifier has a plurality of reference resistors for selection.

13. An OTP memory as recited in claim 10, wherein the sense amplifier has a test device that has a control signal to sweep the device into different resistance values, wherein the equivalent resistance of the device is used as a test reference resistance to sense the OTP cells.

14. An OTP memory as recited in claim 13, wherein the test device can be monitored for voltage or current during sweep tests.

15. An OTP memory as recited in claim 10, wherein the OTP element is a fuse that includes at least one of polysilicon, silicided polysilicon, silicide, polymetal, metal, metal alloy, thermally isolated active region, CMOS gate, contact, or via.

16. An OTP memory as recited in claim 10, wherein the OTP element is an anti-fuse that includes at least one of contact/via with dielectric in between gate and MOS body with gate oxide in between.

17. An OTP memory as recited in claim 10, wherein at least one of the OTP cells has at least one program selector that is a junction diode constructed from an isolated active region on a CMOS well, and wherein the two terminals of the junction diode are implanted with the same source or drain implant in a CMOS process.

18. An OTP memory as recited in claim 10, wherein at least one of the OTP cells has at least one program selector that is a polysilicon or isolated active-region diode built on a polysilicon or isolated active-region structure, and wherein the two terminals of the diode are implanted with the same source or drain implant in a CMOS process.

19. A method for testing a One-Time Programmable (OTP) memory, comprising:
providing a plurality of OTP cells, at least one of the OTP cells include at least one OTP element coupled to a bitline (BL) and to at least one program selector with an enable signal, at least one of the OTP cells being organized as a two-dimensional array with the BLs of the OTP cells in the same columns coupled as single BL and the enable signal of the OTP cells in the same rows coupled as a single WL, at least one row or column decoder to generate signals to select at least one row or column, at least one sense amplifier coupled to at least one BLs to sense at least one OTP cell into logic states, and at least one control signal coupled to at least one row or column decoders to turn on or off any two adjacent rows or columns; and
generating test patterns with alternative logic 0 and 1 states by setting the control signals to turn on or off the selected rows or columns through the at least one sense amplifier.

* * * * *